United States Patent [19]
Mann et al.

[11] Patent Number: 6,121,087
[45] Date of Patent: *Sep. 19, 2000

[54] INTEGRATED CIRCUIT DEVICE WITH EMBEDDED FLASH MEMORY AND METHOD FOR MANUFACTURING SAME

[75] Inventors: Richard A. Mann, Torrance; Eugene R. Worley, Irvine, both of Calif.

[73] Assignee: Conexant Systems, Inc., Newport Beach, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/665,783

[22] Filed: Jun. 18, 1996

[51] Int. Cl.⁷ ..................................... H01L 29/78
[52] U.S. Cl. .......................... 438/258; 438/261; 438/267
[58] Field of Search ..................... 257/316, 317, 257/318; 438/255, 266, 267, 257, 253, 254, 700, 744, 743, 753, 295, 412, 587, 258, 261

[56] References Cited

U.S. PATENT DOCUMENTS

| | | | |
|---|---|---|---|
| 3,859,222 | 1/1975 | Squillace et al. | 252/79.3 |
| 5,455,792 | 10/1995 | Yi | 365/185.2 |
| 5,851,887 | 12/1998 | Caldwell et al. | 438/295 |

FOREIGN PATENT DOCUMENTS

| | | | |
|---|---|---|---|
| 0387889 | 3/1990 | European Pat. Off. . | |
| 58-154273 | 9/1983 | Japan | 257/319 |
| 60-246678 | 12/1985 | Japan . | |
| 60-246679 | 12/1985 | Japan . | |
| 61-131483 | 6/1986 | Japan | 257/318 |
| 62-43179 | 2/1987 | Japan | 365/185 |
| 4-287976 | 10/1992 | Japan | 257/319 |
| 9410706 | 5/1994 | WIPO . | |

*Primary Examiner*—Donald L. Monin, Jr.
*Attorney, Agent, or Firm*—Price Gess & Ubell

[57] ABSTRACT

The switching properties of the disclosed device, low off current and high on current, also allows the device to be employed to replace EEPROM, fuses, anti-fuses or other electrically-alterable non volatile switching devices in programmable logic devices. The disclosed device can be fabricated with low cost methods. The manufacturing methods are compatible with current tools and procedures which allows the device to be added to CMOS circuits to replace masked ROM with more flexible flash memory at a modest increase in cost. The cell operational method and manufacturing methods allows the size of the memory element to be scaled smaller to maintain a low cost and high performance as the minimum feature size of microelectronic circuits is reduced in the future. The disclosed cell approach also offers simpler programming methods to simplify memory array design, supports higher cell currents for high speed applications, and uses lower cost manufacturing methods than an "ETOX" cell approach. Furthermore, a new etching technique is disclosed which can used in the manufacture of the disclosed cell which allows a very thin gap to be etched in a polysilicon layer.

9 Claims, 40 Drawing Sheets

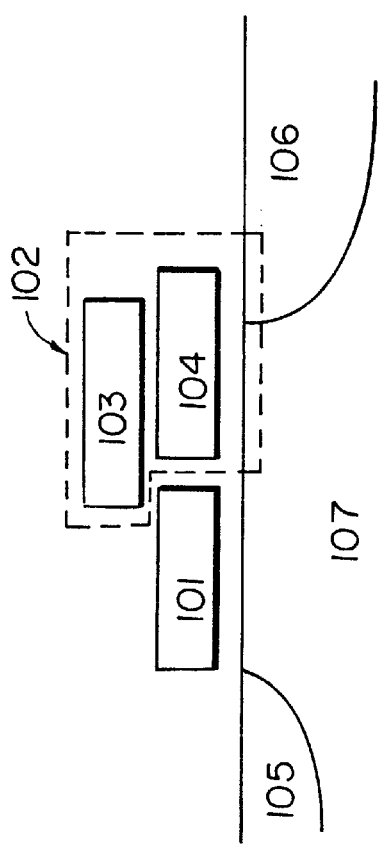
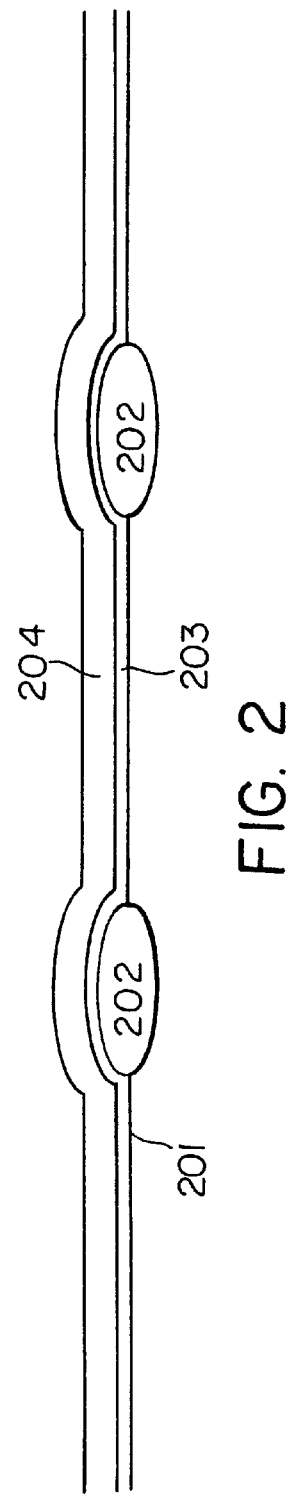
FIG. 1
FIG. 2

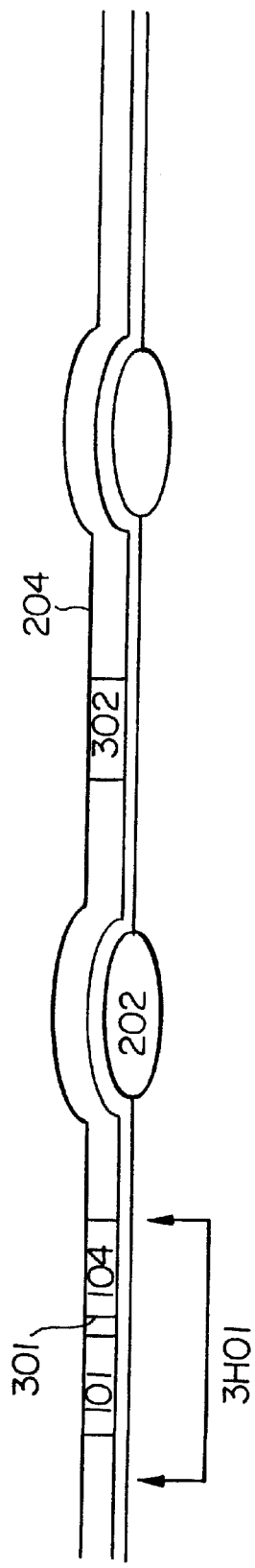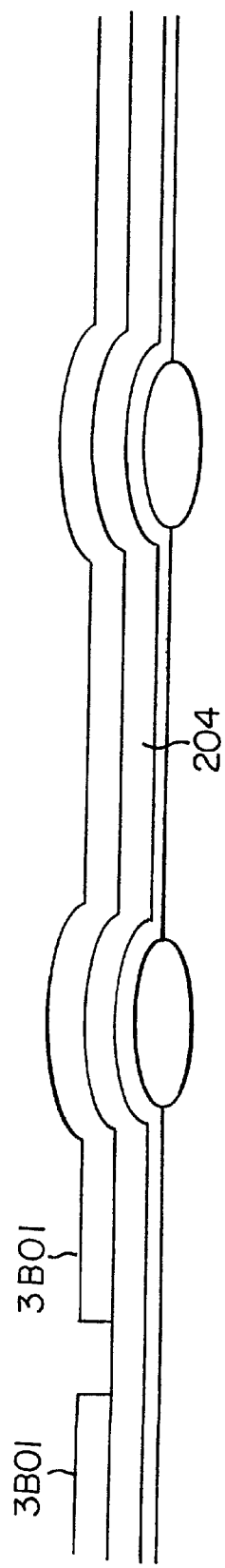

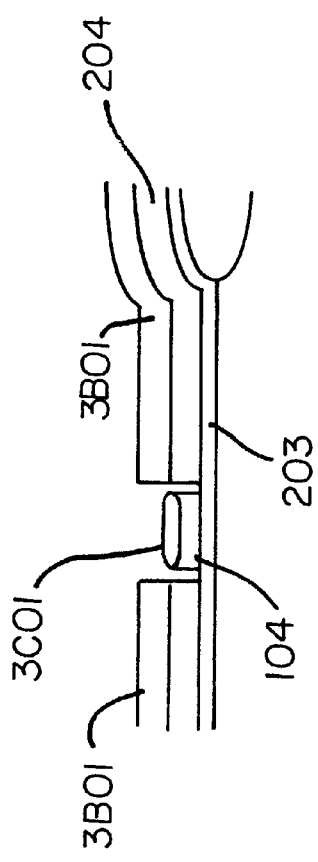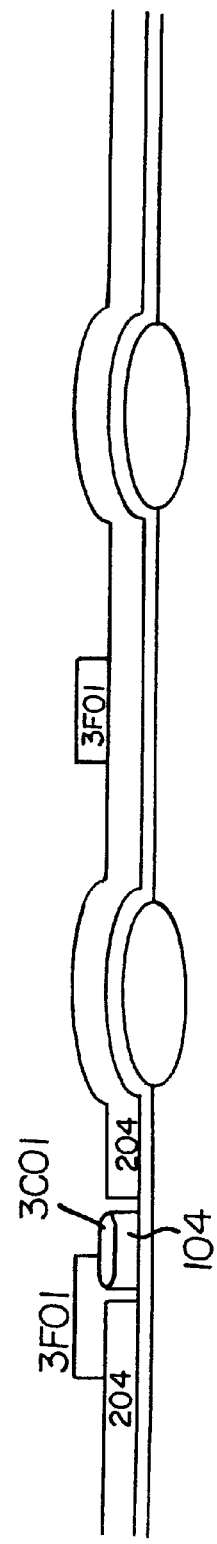

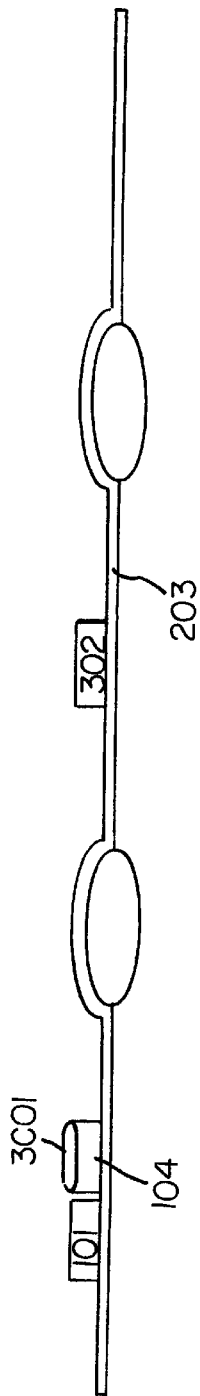
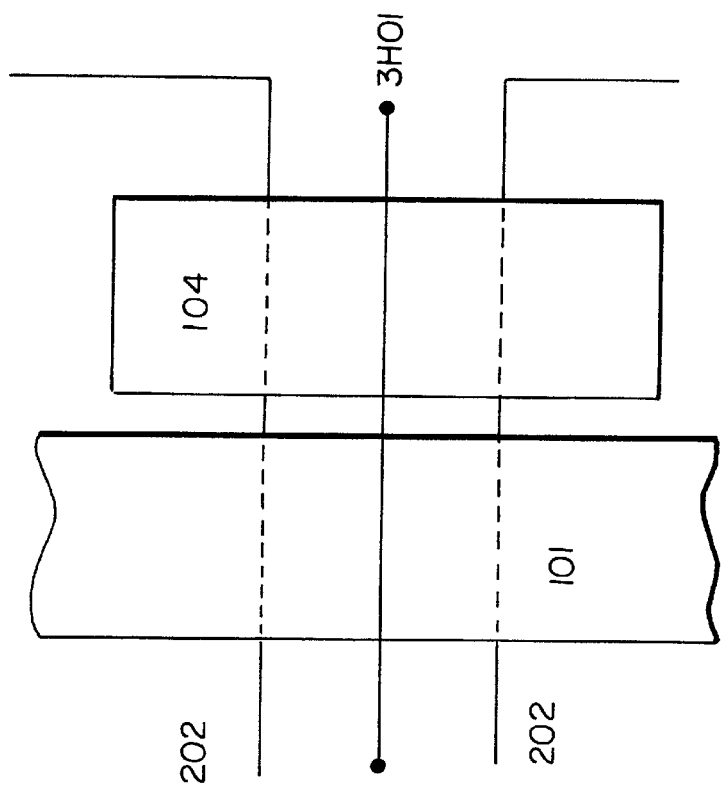
FIG. 3G
FIG. 3H

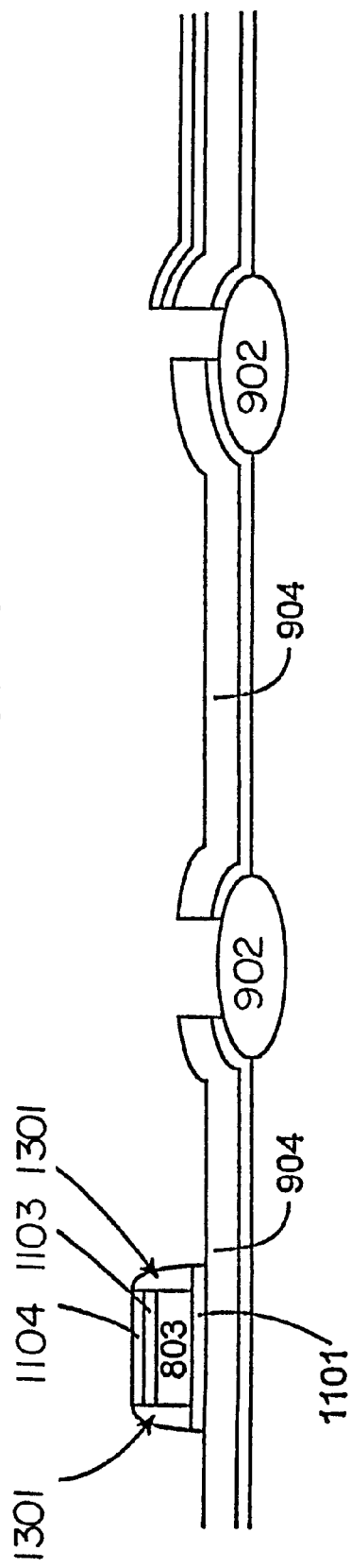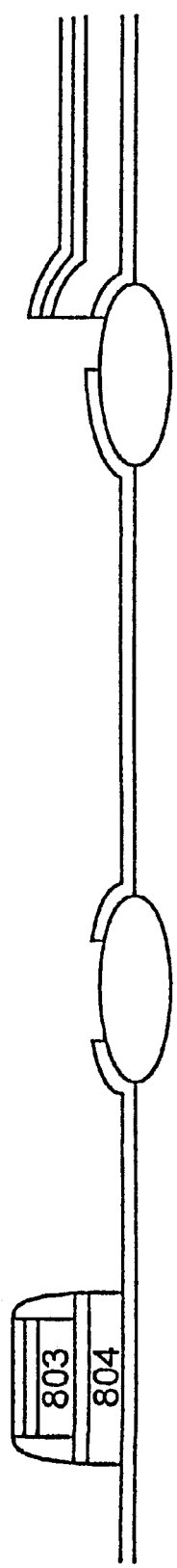

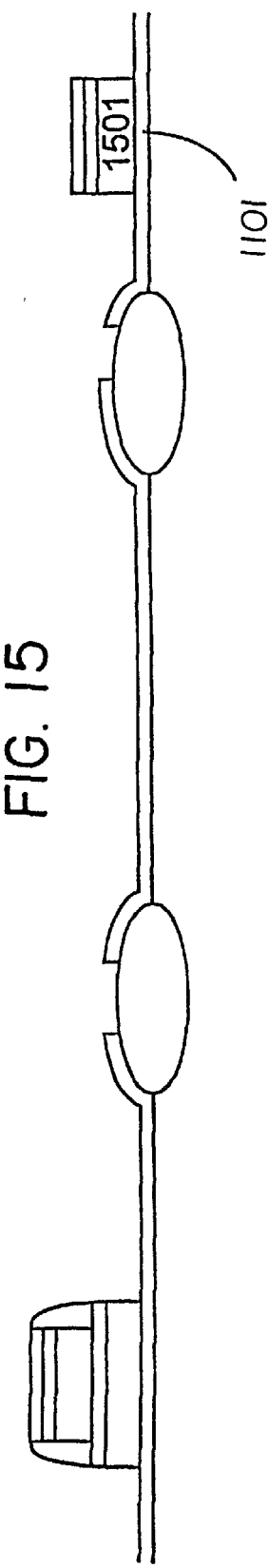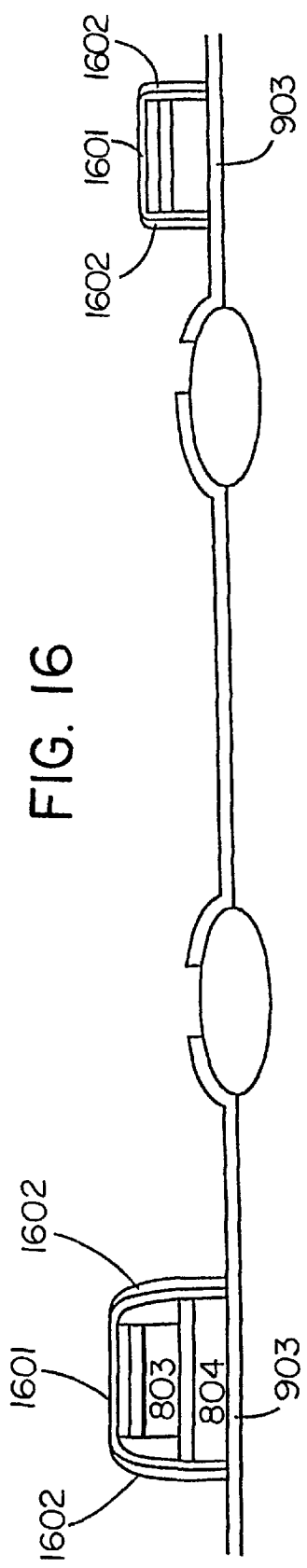

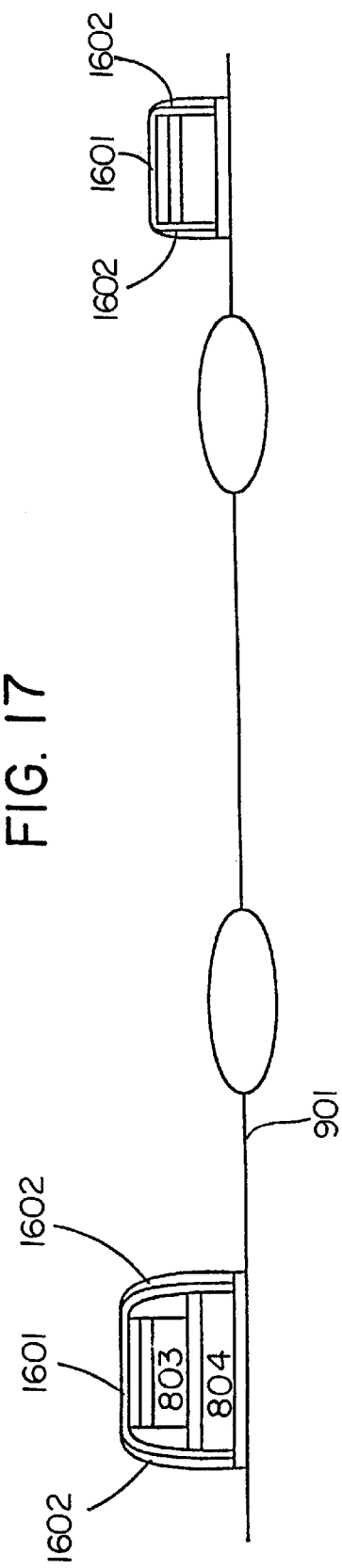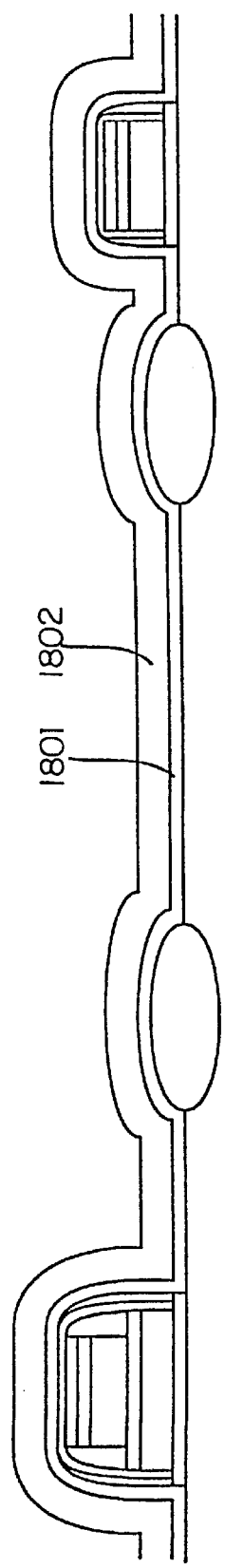

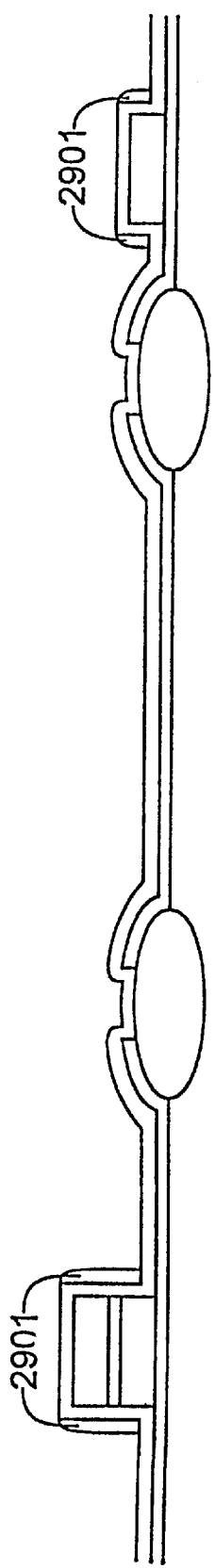
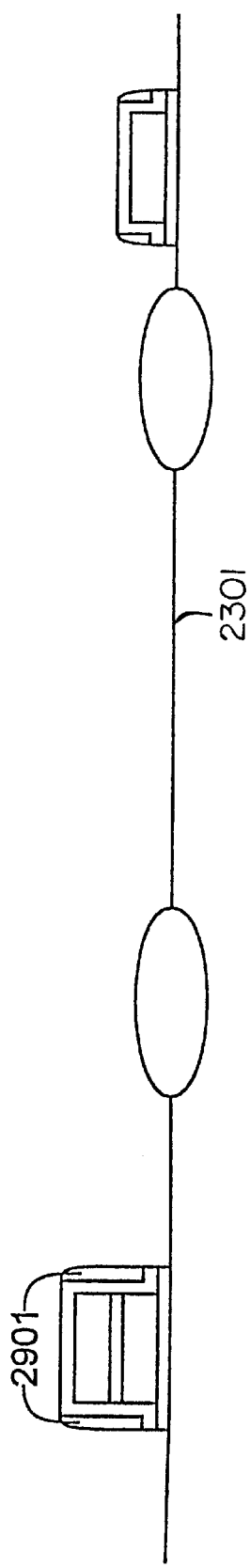

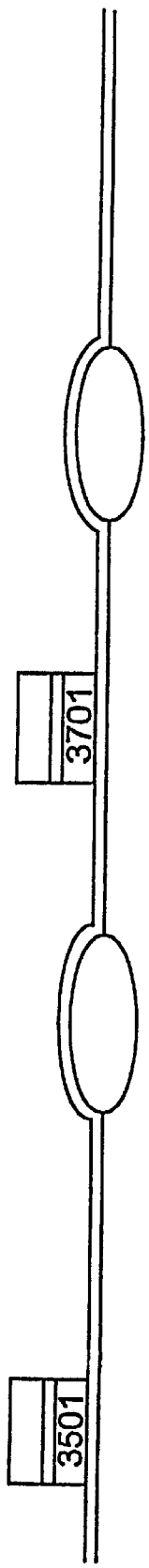
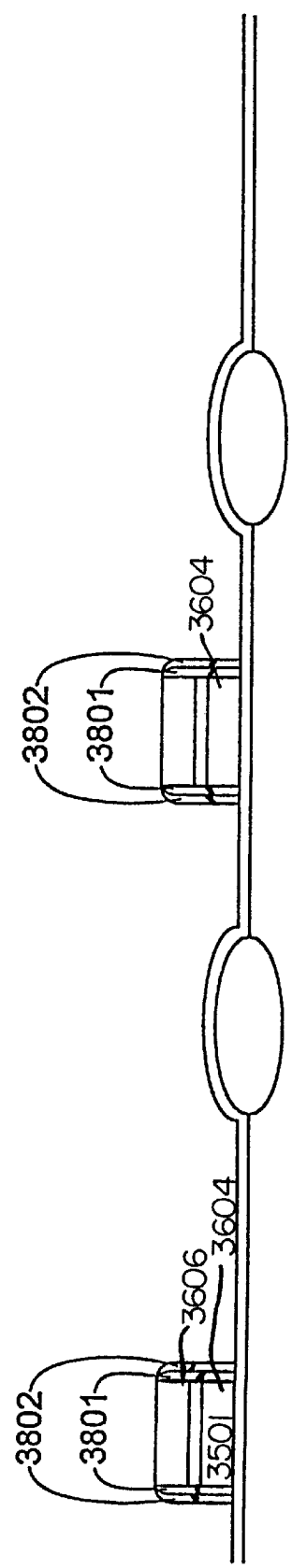

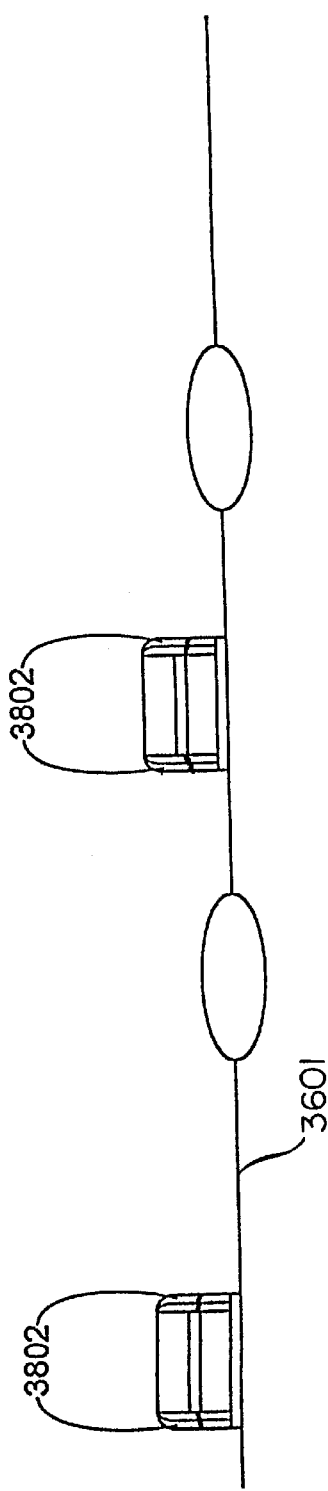
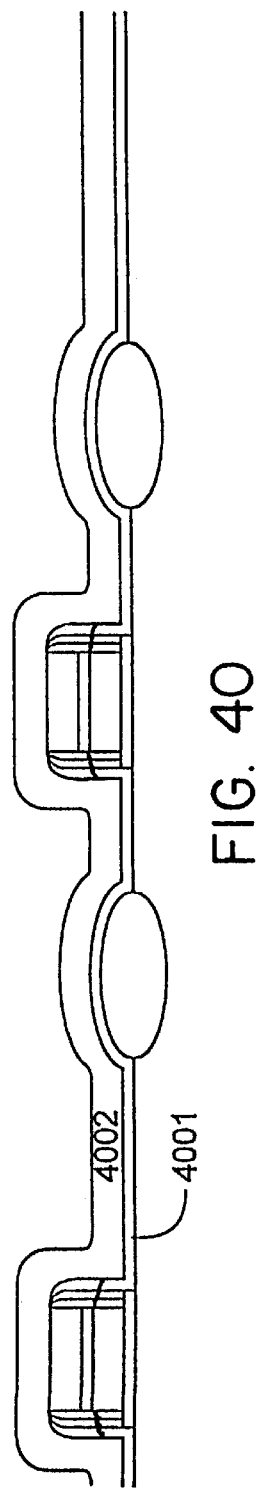

INTEGRATED CIRCUIT DEVICE WITH EMBEDDED FLASH MEMORY AND METHOD FOR MANUFACTURING SAME

FIELD OF THE INVENTION

This invention relates generally to the field of integrated circuit devices, and more particularly relates to an integrated circuit device having embedded flash memory therein and to a method of manufacturing such a device.

BACKGROUND OF THE INVENTION

Non-volatile memory devices are an important and growing segment of the electronics industry. Non-volatile memory devices retain data or program information without the sustained application of power to the device. Electrically reprogrammable non-volatile memory devices allow the user to change the contents of the memory and retain that information after power is removed from the device: examples are electrically-erasable programmable read-only memory (EEPROM), and flash memory. Flash memory circuits enjoy lower costs than EEPROM since the number of transistors required to execute the memory function is reduced by a configuration which erases large (more than one bit) blocks of the memory in parallel or in a "flash."

Flash memory is a very rapidly growing segment of the microelectronics industry with applications in almost all types of electronic products and systems. For mass memory applications the cost of the memory function is very important. Increasingly, flash memory is employed in what has been termed "embedded" applications where the nonvolatile memory function is incorporated into some other kind of chip, such as a microcontroller, digital signal processor (DSP), disc drive controller, or the like. This embedded approach can improve overall system performance, reduce size and costs by eliminating the need for two separate chips.

Flash memory devices have increased value added in these embedded or highly integrated applications. However, traditional flash memory devices and manufacturing methods present challenges for embedded applications. Typical flash memory cells switch information more slowly than similar CMOS ROM cells. This means that either flash memory must be supplemented by faster-switching volatile memory or the system performance must be slowed to the point where flash memory can keep up. In addition many flash memory devices require greater than 30% increases in manufacturing steps when compared to typical CMOS devices.

A flash memory device which offers high performance in switching speed with rates close to that of standard CMOS would be of great benefit to embedded applications. Two significant embedded applications where flash memory speed directly affects throughput or chip speed are DSP and microcontrollers.

SUMMARY OF THE INVENTION

In view of the foregoing, the present invention relates to a electrically-alterable non-volatile information storage device with applications in data, program storage and the manufacture of programmable logic. The disclosed devices are well-suited to "flash" memory applications in which data is written for storage as bits, bytes, or pages but which is generally erased for rewriting in larger blocks of memory.

The disclosed memory device allows the use of flash memory in higher-applications enabling new types of useful electronic circuits and systems. The invention consists of a higher performance cell with merged floating gate and control gate. The higher performance capability of this flash cell device is achieved at low cost by the disclosed cells unique architecture by using the disclosed methods. The cell design and manufacturing methods allow the use of thin dielectrics to gate the conduction channel of the device, thus enabling higher on current performance. The memory device in accordance with the present invention functions in all current applications for flash memory and is cost competitive in manufacture. However, the memory device in accordance with the present invention offers significant improvements in performance over competing technologies. The higher performance of this novel device would allow the direct use of the memory transistor in high speed applications, whereas a lower performance traditional non-volatile memory transistor would require that the information from the non-volatile device be transferred to static RAM or other type of volatile storage having higher switching speed than traditional non-volatile memories.

The excellent switching properties, low off current and high on current of a device in accordance with the present invention also allows it to be employed to replace EEPROM, fuses, anti-fuses or other electrically-alterable non-volatile switching devices in programmable logic devices.

The memory device in accordance with the present invention can be fabricated with low cost methods. Numerous practical low cost alternative manufacturing flows are disclosed herein to build the new memory device. Unique cell layout and process sequences are defined for each basic method. A method to make self aligned cuts in polysilicon is used in one of the alternative methods of manufacture. The manufacturing methods in accordance with the present invention are compatible with current tools and procedures, allowing the memory device in accordance with the invention to be added to CMOS circuits to replace masked ROM with more flexible Flash memory at a modest increase in cost.

The cell operational method and manufacturing methods in accordance with the present invention allow the size of this memory element to be scaled smaller to maintain a low cost and high performance as the minimum feature size of microelectronic circuits is reduced in the future. The disclosed cell approach also offers simpler programming methods to simplify memory array design, supports higher cell currents for high speed applications and uses lower cost manufacturing methods than the more common "ETOX" cell approach. Furthermore, a new etching technique is disclosed which can used in the manufacture of the disclosed cell which allows a very thin gap to be etched in a polysilicon layer. In addition, novel process methods are disclosed that enable the cell to be manufactured in a practical manner by allowing thin dielectrics layers which are formed early in the process to be protected while dielectric is removed in other locations.

The memory device in accordance with the present invention can be used for both embedded and stand-alone applications. The inherent switching speed of a device in accordance with the present invention can be about 200% (or more) faster than typical flash memory devices. The manufacture of this device is compatible with conventional CMOS process technologies and requires only about 25% increase in the number of manufacturing steps to add flash memory devices to a CMOS process.

The high performance and modest cost of a memory device in accordance with the present invention allows it to be used in many high and low performance applications.

Applications of the present invention can range from high-speed non volatile memory embedded within another type of integrated circuit, to high performance non-volatile switches in programmable logic devices. A cell in accordance with the present invention could also be used competitively for low speed mass memory applications.

BRIEF DESCRIPTION OF THE DRAWINGS

The foregoing and other features of the present invention may perhaps be best understood with reference to a detailed description of specific embodiments of the invention, which follows, when read in conjunction with the accompanying drawings, wherein:

FIG. 1 is a cross section of a silicon substrate showing an embodiment of the claimed memory cell.

FIG. 2 is a cross section of a silicon substrate showing the resulting structure after first polysilicon deposition.

FIG. 3A is a cross section of a silicon substrate showing the remaining location of first polysilicon after etching.

FIG. 3B is a cross section of a silicon substrate showing a patterned layer of nitride over the first polysilicon.

FIG. 3E is a cross section of a silicon substrate showing the structure after anisotropic etching of the now exposed polysilicon.

FIG. 3F is a cross section of a silicon substrate showing the structure after nitride removal and after a photoresist has been patterned on top of the polysilicon.

FIG. 3G is a cross section of a silicon substrate showing the remaining structure after anisotropic etching of the exposed polysilicon.

FIG. 3H is a planar view of the structure shown in cross section in FIG. 3A.

FIG. 13 is a cross section of a silicon substrate showing the resulting structure after oxide spacers are formed.

FIG. 14 is a cross section of a silicon substrate showing the resulting structure after remaining exposed first polysilicon is etched.

FIG. 15 is a cross section of a silicon substrate showing the resulting structure after the second polysilicon is etched to define the high voltage transistor gates.

FIG. 16 is a cross section of a silicon substrate showing the resulting structure after the formation of dielectric spacers.

FIG. 17 is a cross section of a silicon substrate showing the resulting structure after the removal of all oxides from the exposed surface of the substrate.

FIG. 18 is a cross section of a silicon substrate showing the resulting structure after third polysilicon deposition.

FIG. 29 is a cross section of a silicon substrate showing the resulting structure after the formation of dielectric spacers.

FIG. 30 is a cross section of a silicon substrate showing the resulting structure after all oxides are removed from the exposed surface of the substrate.

FIG. 37 is a cross section of a silicon substrate showing the remaining location of the nitride, oxide, and first polysilicon after etching of those layers.

FIG. 38 is a cross section of a silicon substrate showing the resulting structure after the formation of dielectric spacers.

FIG. 39 is a cross section of a silicon substrate showing the resulting structure after all oxides are removed from the exposed surface of the substrate.

FIG. 40 is a cross section of a silicon substrate showing the resulting structure after second polysilicon deposition.

DETAILED DESCRIPTION OF SPECIFIC EMBODIMENTS OF THE INVENTION

Figure 3C:
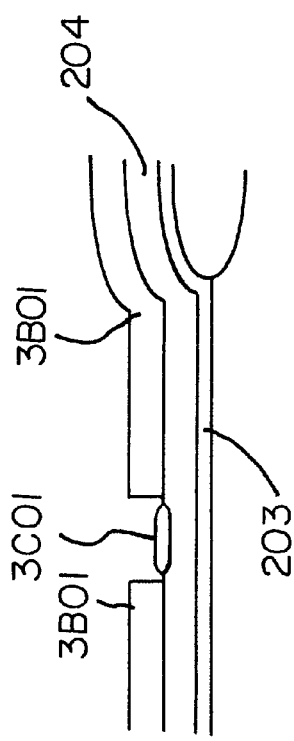
FIG. 3C is a cross section of a silicon substrate showing where the polysilicon has been oxidized in the location where the overlying nitride has been etched away.

The disclosed high performance Flash memory cell teaches a novel way to manufacture a split gate Flash memory cell in which each device contains a word line gate and a floating gate which sets the state of the cell. An erase control gate is provided to control potentials associated with program and erasure of the cells. High potentials required for programming and erase operations are applied to the erase control gate and do not directly appear across the word line gate or the floating gate. This feature allows the dielectrics employed for the word line gate to be thinner, since the word line gate will not need to withstand the higher programming and erase biases. The result is a higher on state current and a dense cell geometry. The practical realization of the memory cell requires the use of new process methods and unique process sequences which are described in the four embodiments or the invention described below. The method preferred for a given manufacturing plant will be influenced by available tooling and experience with specific methods needed for the realization of the three gate cell. Also certain embodiments have certain performance advantages or may be more easily optimized to achieve desired results. Moreover, certain embodiments can be made more densely than other embodiments. Thus, which embodiment is preferred will depend on manufacturing, performance, and design constraints as noted herein. Furthermore, the desired or available power supply voltages and other desired electrical specifications for the cell may suggest that one embodiment will be more desirable than another.

New process methods and novel process sequences are disclosed to enable the practical manufacture of the disclosed cell. Because the details of many of the processing steps are well known to those ordinarily skilled in semiconductor manufacturing, many of the processing details are not embellished upon. However, the basic manufacturing flows of the four embodiments are described, and several well known processing techniques are described which have the potential to increase the performance of all of the embodiments.

As well as showing the steps for forming the memory cell in the array area of the circuit, the cross sectional drawing herein will also show how a low voltage CMOS (Complementary-Metal-Oxide-Semiconductor) transistor and a high voltage CMOS transistor can be built simultaneously in the periphery area of the circuit, thus underscoring the present invention's utility and manufacturing simplicity. The CMOS circuitry generally consists of all of the other circuitry used on the flash memory device that does not constitute the array of cells, and performs circuit functions necessary to routing signals to and from the array, such as decoding. The low voltage CMOS transistors, used to perform logical functions, are designed to handle nominal voltages signal (e.g., 5 Volts), while the high voltage CMOS transistors are used to shuttle higher voltage signals (e.g., 12 Volts) to the array to perform the erasing and programming functions. Because of the application of higher voltages to the high voltage CMOS transistors, these devices will typically require a thicker gate oxide layer underneath their gates to prevent oxide wearout or breakdown. Also, the high voltage CMOS junctions will normally need to be deeper and more smoothly graded to sustain high voltages without going into avalanche breakdown. The layer thicknesses in the figures are not perfectly drawn to scale. The reader should consult the discussion accompanying the relevant figure in order to determine a layer's actual target thickness.

The first embodiment of the claimed memory cell is shown in FIG. 1. The cell in FIG. 1 is comprised of two transistors in series, namely a word line gate transistor 101 and a storage transistor 102. Storage transistor 102 further consists of an erase control gate 103 and a floating gate 104. Diffused regions appear on the outside edges of the two transistors which constitute a bit line diffusion 105 and a source diffusion 106. The cell of FIG. 1 would typically be built on a lightly doped p-type crystalline substrate 107. The memory cell shown in FIG. 1 can be made by executing the following sequence of steps, which can be best appreciated with reference to the cross-sectional diagrams of FIGS. 2 through 6.

Referring to FIG. 2, field oxide regions 202 are thermally grown in a lightly p-doped silicon crystalline substrate 201 for the purpose of electrically isolating different cells from one another and isolating the cells from the CMOS transistors in the periphery. A high quality thermal oxide 203 is grown on the wafer surface to a thickness which depends upon the desired thickness of the gate oxide to be employed in the low voltage CMOS oxide transistor. A typical range of thicknesses for oxide layer 203 would be 120 to 150 Angstroms for 5.0V applications. Note that oxide layer 203 is employed for both the word line gate 101 and the storage gate 102. This offers significant advantages in that the word line gate transistor 101 and the storage transistor 102 both have high drive current afforded by the thin dielectric. Next a polysilicon layer 204 is deposited on top of the thermal oxide 203 to a preferred thickness of 2000 to 3000 Angstroms.

Referring to FIG. 3A, polysilicon layer 204 has been etched to define the outer edges of word line gate 101 and floating gate 104. Also, a gap 301 has been anisotropically etched to define the inner edges of word line gate 101 and floating gate 104. Both the gap and the outer edges may be simultaneously patterned and etched using traditional photolithography processing methods. However, it is preferred to use the polysilicon etch method described in FIGS. 3B–3H to have the best cell operation. This method allows the self aligned formation of a gap in the polysilicon 204 which is smaller than can be achieved with conventional lithography. This method supports effective hot electron programming of floating gate 104 by source side injection and also provides a much smaller layout than could be achieved with conventional methods.

Figure 3D:
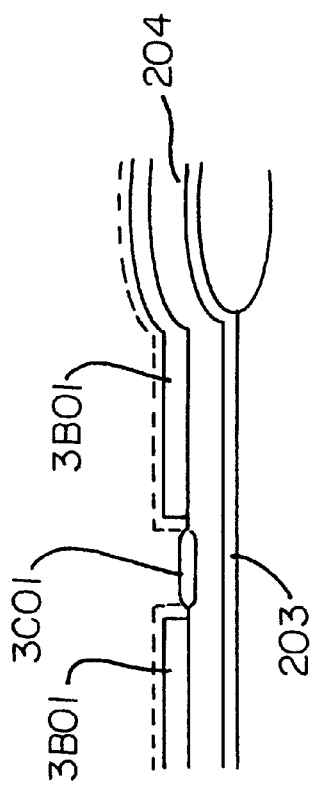
FIG. 3D is a cross section of a silicon substrate showing the remaining structure when the nitride is slightly isotropically etched.

Referring to FIG. 3B, polysilicon 204 is covered with a nitride layer 3B01 to a preferred thickness of 2,000 to 4,000 Angstroms. The nitride layer is then patterned and etched by traditional means leaving the structure shown in FIG. 3B. Referring to FIG. 3C, which shows a magnified view of the nitride window etched in FIG. 3B, the exposed polysilicon 204 is oxidized, forming an oxide layer 3C01 which is preferably 100 to 200 Angstroms thick. Notice that nitride layer 3B01 is not subject to oxidation. Referring to FIG. 3D, nitride 3B01 is subject to an isotropic etch to remove a very small amount of nitride 3B01 on all edges of nitride 3B01. The etchant used to remove the nitride should not substantially attack the polysilicon 204 or oxide 3C01, and a solution of dilute hot phosphoric acid is suggested. Referring to FIG. 3E, the polysilicon 204 is anisotropically etched where exposed. Where the polysilicon 204 is protected by either nitride 3B01 or oxide 3C01, it will remain intact. Where the polysilicon is etched away, it forms gap 301 seen in FIG. 3A. Where polysilicon 204 is left unetched under oxide 3C01 constitutes the floating gate 104. The remaining nitride 3B01 is then removed after etching the gap 301. Referring to FIG. 3F, a photoresist 3F01 is applied over the polysilicon 204 and pattern, leaving the structure shown. Referring to FIG. 3G, the exposed polysilicon 204 is anisotropically etched, and the photoresist 3F01 is then removed, leaving the structure shown. Notice that the oxide 3C01 has not been removed and will act to protect the underlying polysilicon 104 film the anisotropic etch. Notice that this etch defines the outside edge of the word line 101 as well as the low voltage CMOS transistor gate 302. Oxide 203 acts as the gate oxide for the floating gate 104, the word line gate 101, and the low voltage CMOS gate 302.

This etching technique used to form gap 301 allows for the formation of an extremely thin gap in polysilicon 204. The gap's thickness can be tightly controlled by controlling the etch rate of the overlying nitride 3Y01. This technique has utility above that simply disclosed in formation of the above Flash EPROM cell. Because the gap that is produced is very thin, it can be used to form a series of transistor gates which do not require significant layout area for a diffusion or other connection between the gates to help jumper a signal through the gate series. A lower series resistance can be achieved by implanting dopants into the gap after the etch. However, in applications where a slightly higher resistance can be tolerated, no special implant or method is needed to allow the channel of the storage gate 102 to communicate with the word line gate 101. This is because channel formation will naturally extend beyond the physical edge of the gate and can extend to touch the channel of the next gate in series if the gap is sufficiently narrow. In this way, very dense logic gates similar in function to charge-coupled-devices (CCDs) can be made.

Referring to FIG. 3H, a top down view is shown of the cross sectional structure shown in FIG. 3A, which is marked by vantage point 3H01. Notice that the floating gate 104 has been etched on four sides by the photolithography step discussed in FIG. 3A.

Figure 4:
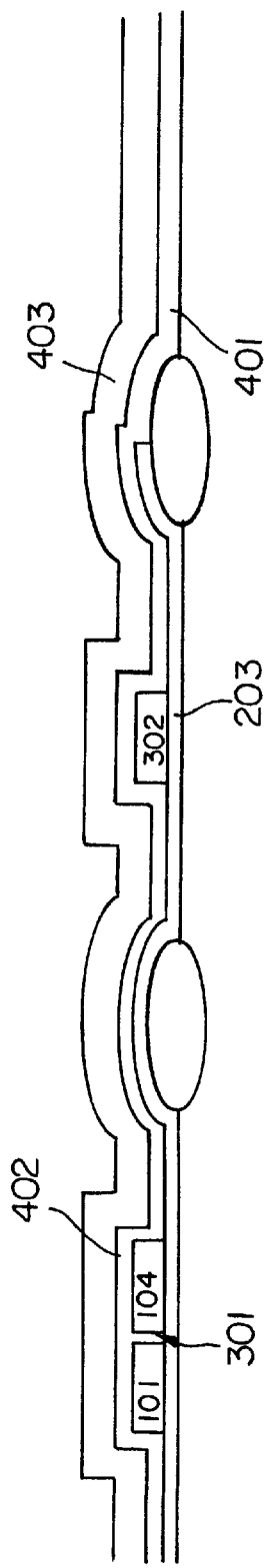
FIG. 4 is a cross section of a silicon substrate showing the resulting structure after second polysilicon deposition.

Referring to FIG. 4, the wafer is next subjected to oxidation to increase the thickness of the oxide on the exposed silicon surfaces to form the dielectrics for the high voltage transistors. The total oxide thickness should be about 250 to 400 Angstroms for best results. Where oxide 401 appears over the floating gate it is referred to as interpoly oxide 402. Oxide 401 should be grown to a thickness which will perform optimally when used as both an interpoly oxide and as the gate oxide for the high voltage CMOS transistors. A thickness of approximately 300 Angstroms is preferred. Next a second layer of polysilicon 403 is deposited on the surface of the wafer.

Figure 5:
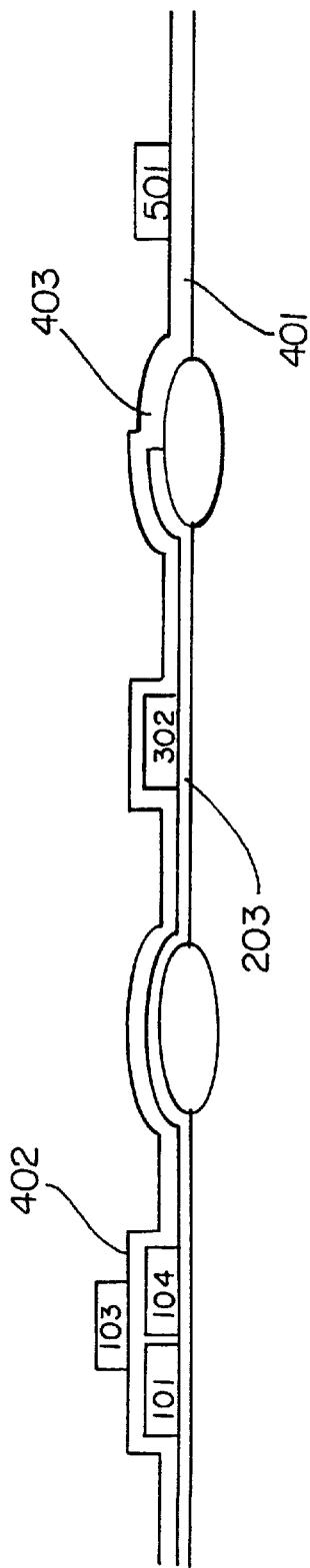
FIG. 5 is a cross section of a silicon substrate showing the remaining location of first polysilicon after etching.

Referring to FIG. 5, polysilicon layer 403 is patterned and anisotropically etched using traditional photolithography methods. This etch defines erase control gate 103. Notice that high voltage CMOS transistor gate 501 is also defined by the etching of polysilicon layer 403 and that oxide 401 provides the gate oxide for the high voltage CMOS transistor. Polysilicon layer 403 should be patterned to produce an erase control gate 103 which overlaps with the underlying floating gate 104 in order to optimize coupling between these two gates.

Figure 6:
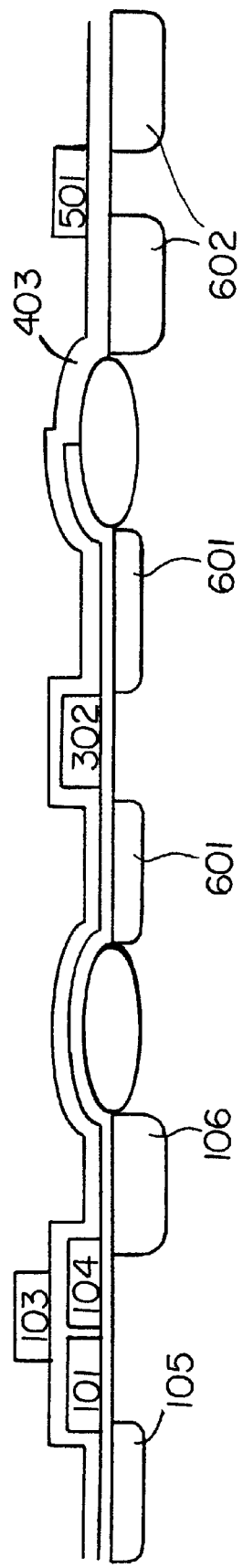
FIG. 6 is a cross section of a silicon substrate showing the position of the diffusion regions after ion implantation.

Referring to FIG. 6, standard processing techniques are used to form low voltage diffusions 601 and high voltage diffusions 602. This is accomplished by first masking off the low voltage diffusion regions and performing an ion implantation step. The ion implantation step causes ions to bombard perpendicularly into the wafer surface. Where the ions become embedded into substrate 201 a high voltage diffusion 602 will be formed. The ions will be of a character (e.g., phosphorous or arsenic) to impart an n-type character to the substrate 201 in the high voltage diffusions 602. Because the low voltage regions are masked off, no ions will be implanted into the substrate 201 in those regions. After the high voltage diffusions 602 have been implanted, high voltage diffusion regions 602 are then masked into order to ion implant the low voltage diffusions 601 in the same manner as previously described. Notice that the ion implantation process and subsequent appropriate thermal drive of the ions are engineered such that the high voltage diffusions 602 are deeper and more smoothly graded than the low voltage diffusions 601 and can therefore carry a higher voltage signal without breaking down. Where the low voltage diffusion appears adjacent to word line gate 101 it is referred to as bit line diffusion 105. Where the high voltage diffusion appears adjacent to floating gate 104 it is referred to as source diffusion 106. Once the formation of both low voltage diffusions 601 and high voltage diffusions 602 are completed, standard processing techniques are used to finished the manufacture of the device to make a fully functional circuit.

Figure 7:
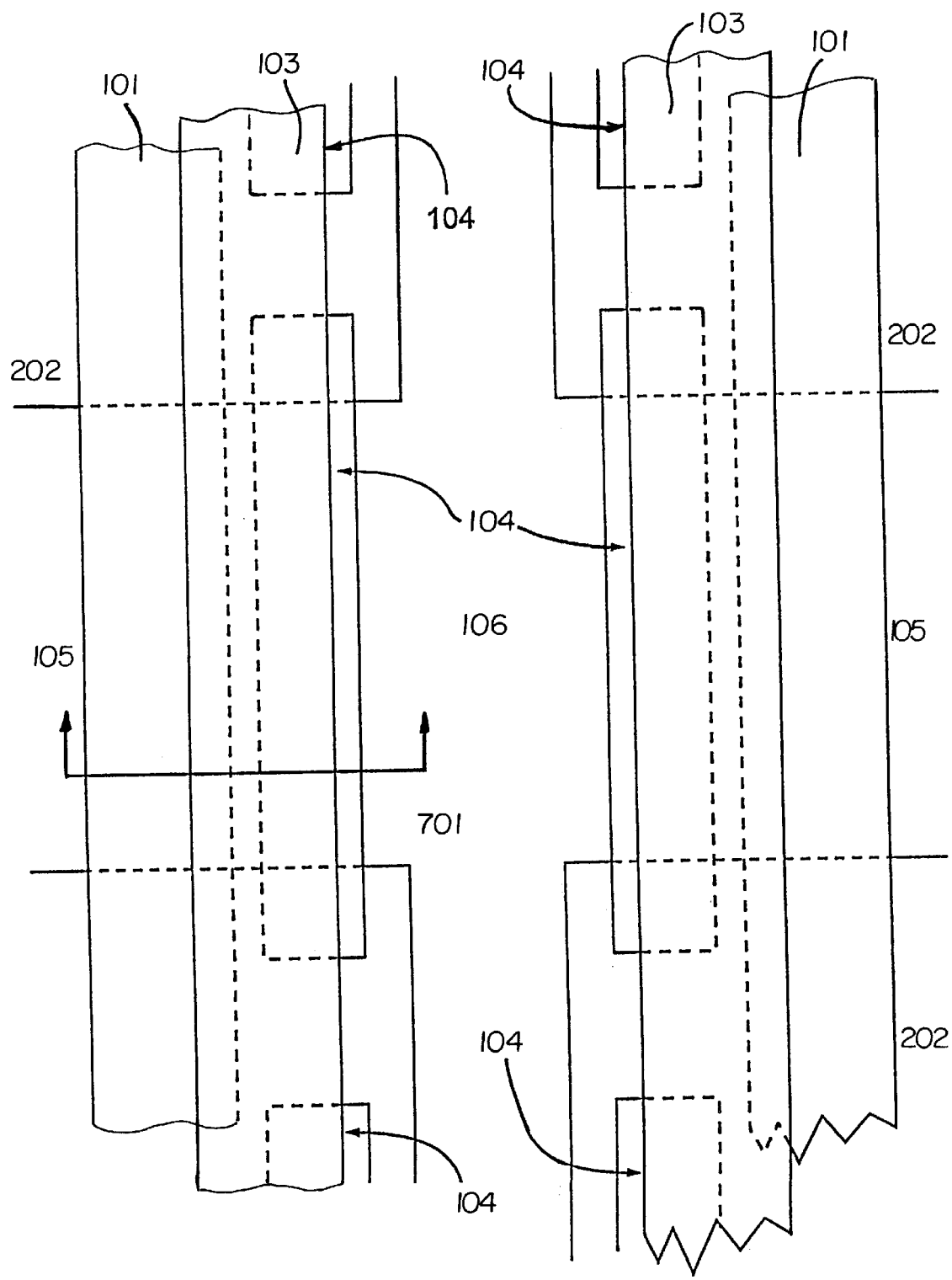
FIG. 7 is a planar view of two completed cells in an array after the processes described in FIGS. 2 through 6 have been completed.

FIG. 7 shows a top down view of two cells after performing the processes described with reference to FIGS. 2 through 6. Notice that it is preferred to use the claimed memory cell in a common source configuration whereby each cell's source diffusion 106 is common to all other cells' source diffusion and each cell's bit line diffusion 105 is shared with only one other cell's bit line diffusion. The vantage point shown in FIG. 1 is denoted by 701. Among the advantages of this first embodiment are higher density and lower costs due to the processing sequence that allows the self aligned formation of a floating gate and word line gate from the same layer of polysilicon. This lowers manufacturing costs, increases layout density, and allows greater flexibility in the selection of erase control gate to floating gate coupling ratio. Also, the thin gate oxides are formed first, and the interpoly oxide is formed with the floating gate and low voltage CMOS gates already defined. No additional processing steps are required to insure isolation between the floating gate and the word line gate.

Figure 8:
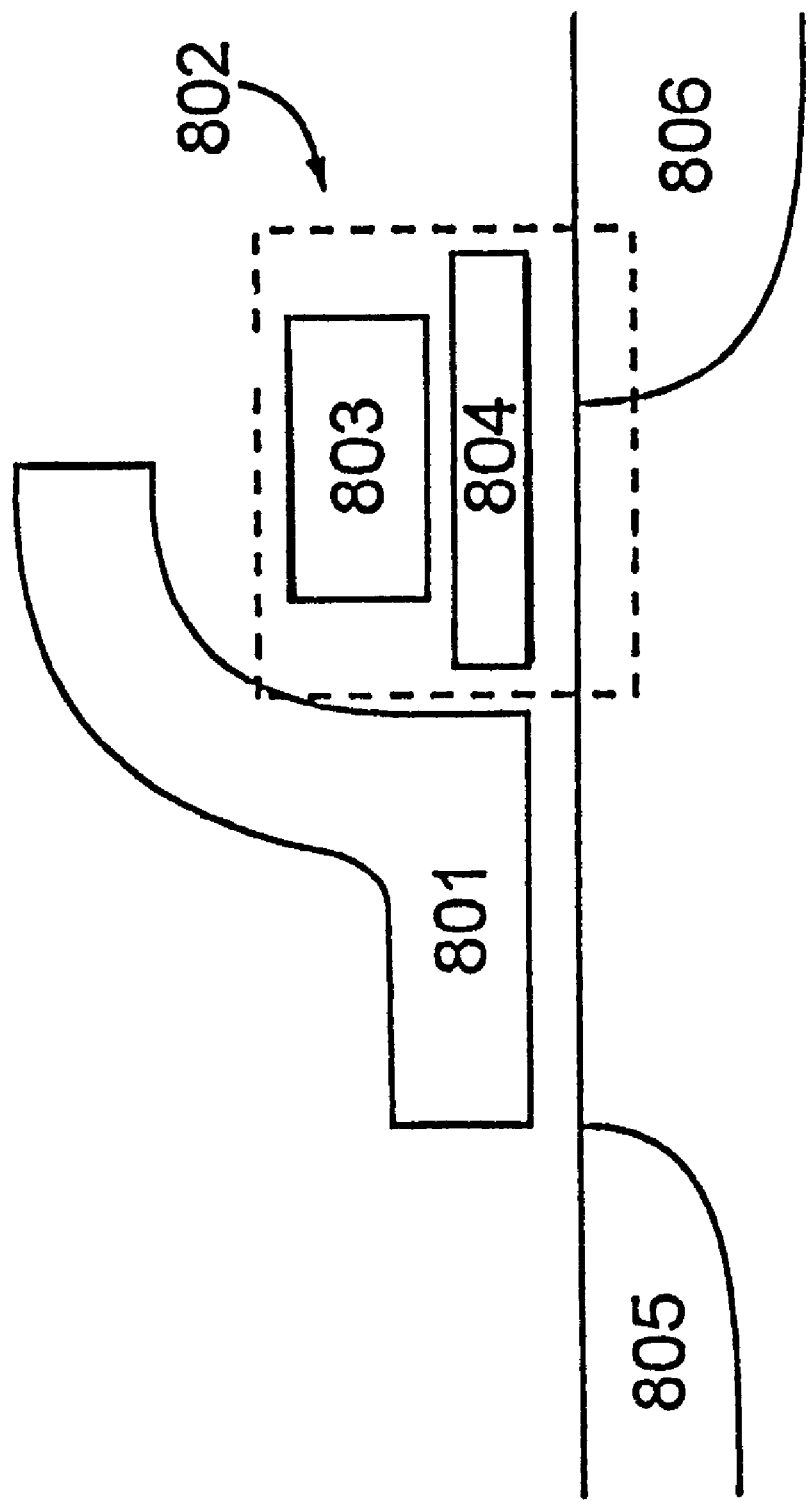
FIG. 8 is a cross section of a silicon substrate showing an embodiment of the claimed memory cell.

A second embodiment of a memory cell in accordance with the present invention is shown in FIG. 8. The cell in FIG. 8 is comprised, as in the first embodiment, of two transistors in series, namely a word line gate transistor 801 and a storage transistor 802. Storage transistor 802 further consists of an erase control gate 803 and a floating gate 804. Diffused regions appear on the outside edges of the two transistors which constitute bit line diffusion 805 and source diffusion 806. The memory cell shown in FIG. 8 can be made by executing the sequence of steps to be described with reference to FIGS. 9 through 20.

Figure 9:
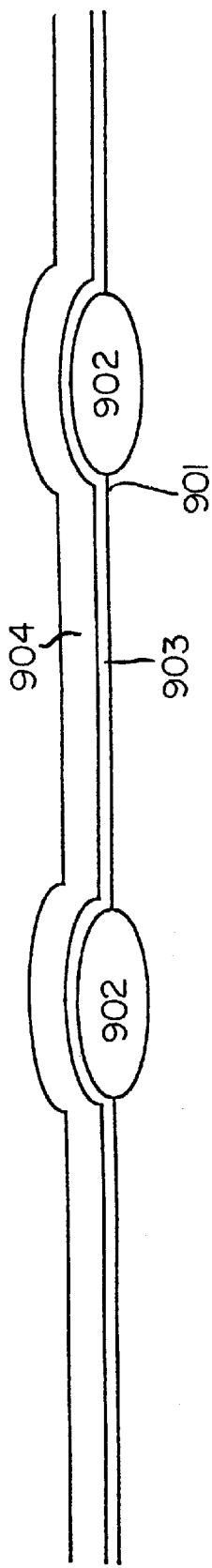
FIG. 9 is a cross section of a silicon substrate showing resulting structure after polysilicon deposition.

Referring to FIG. 9, field oxide regions 902 are thermally grown in a lightly p-doped silicon crystalline substrate 901. Clearly, other field isolation methods such as shallow trench and refill may also be applied in lieu of lower cost local oxidation of silicon method. A high quality thermal oxide 903 is grown on the wafer surface to a thickness of 100 Angstroms in a presently preferred embodiment. Next a polysilicon layer 904 is deposited on top of thermal oxide 903 to a thickness of approximately 500 Angstroms in a presently preferred embodiment.

Figure 10A:
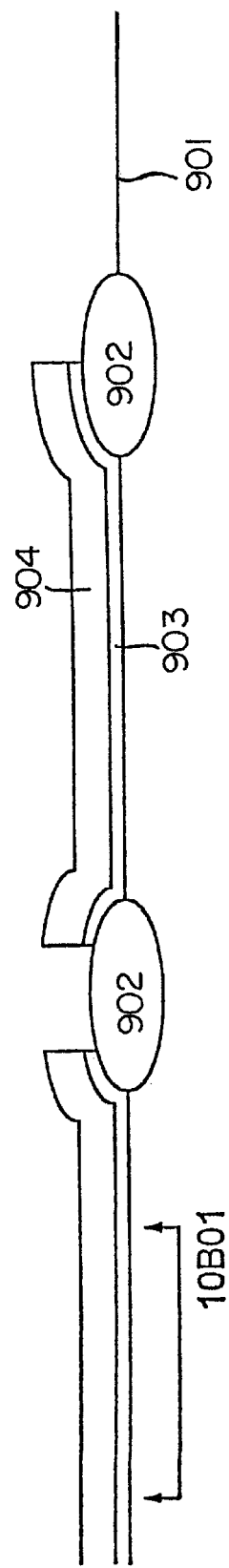
FIG. 10A is a cross section of a silicon substrate showing the remaining location of first polysilicon after etching.
Figure 10B:
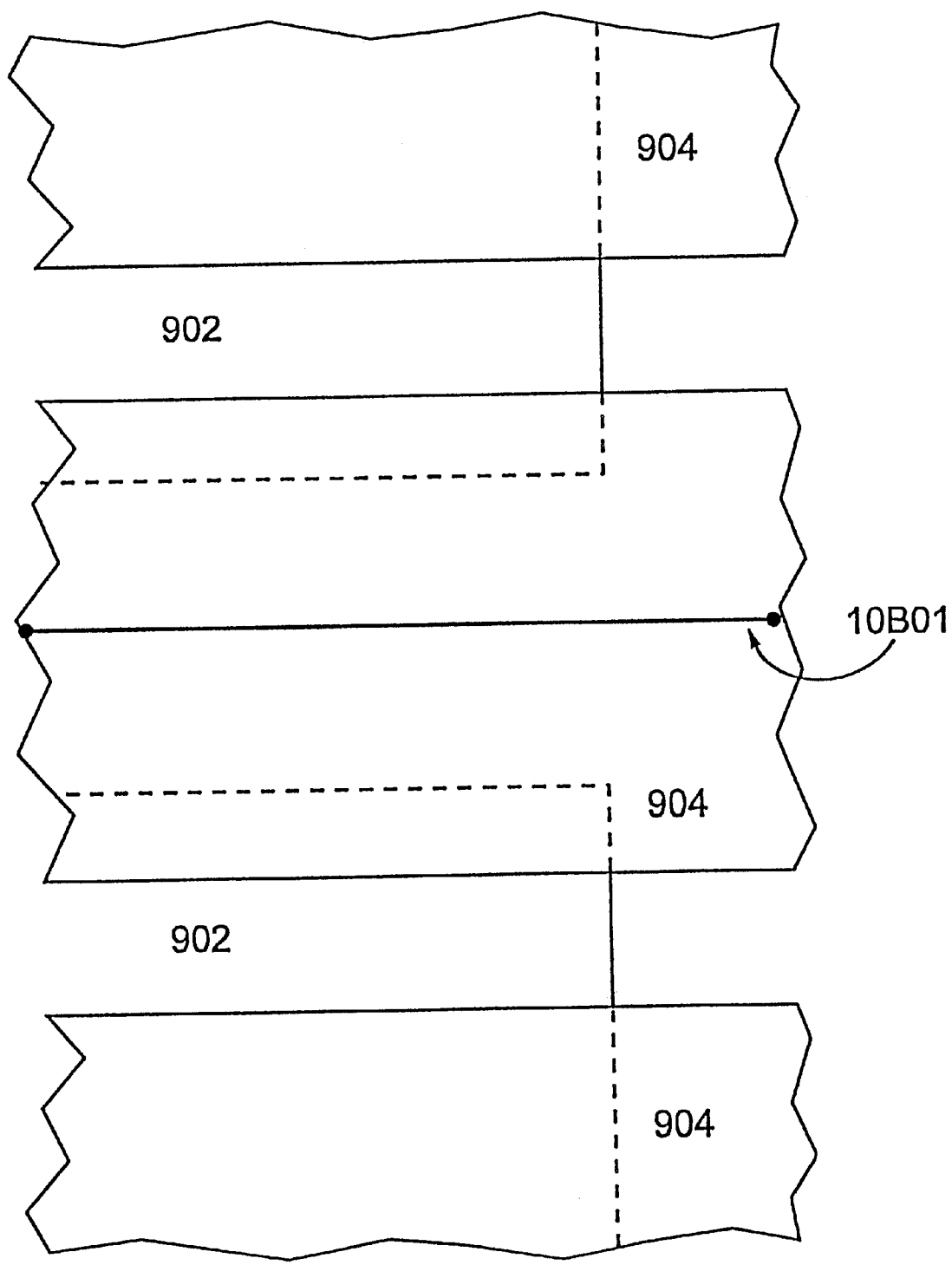
FIG. 10B is a planar view of the structure shown in cross section in FIG. 10A.

Referring to FIG. 10A, polysilicon layer 904 has been patterned and etched using traditional photolithography methods. Notice that polysilicon layer 904 has been left only in the array and will be used to form the floating gate 804. Referring to FIG. 10B, a top view is shown of the cross sectional structure shown in FIG. 10A, which is marked by vantage point 10B01. Notice that polysilicon layer 904 has had slots etched into it where it lies over oxide 902 in the array by the photolithography step described with reference to FIG. 10A.

Figure 11:
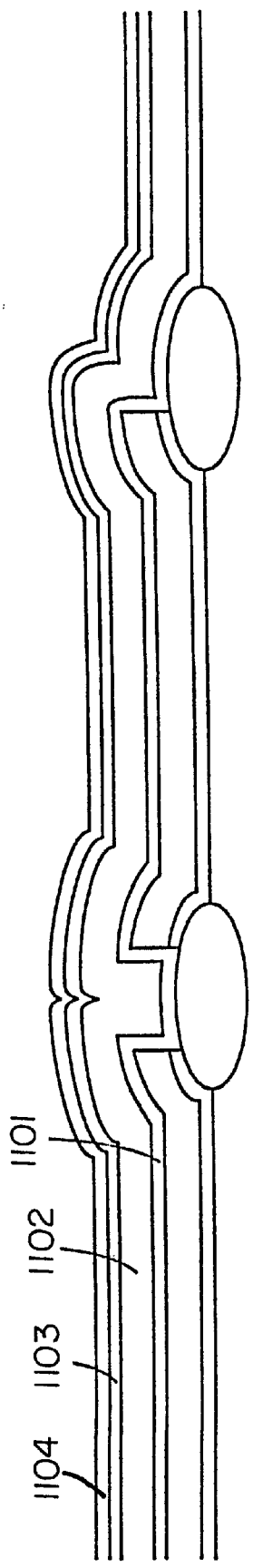
FIG. 11 is a cross section of a silicon substrate showing the resulting structure after interpoly oxide growth, second polysilicon deposition, oxide deposition, and nitride deposition.

Referring to FIG. 11, after the exposed portions of substrate 901 are cleaned, a high quality interpoly oxide 1101 is formed. The preferred method is a combination of thermal oxidation followed by the deposition of oxide by Chemical Vapor Deposition (CVD). It is complicated to predict what method would be best. CVD oxide for part of the oxidation gives better control over the shape of the interpoly oxide and can reduce cell disturb problems. When polysilicon over field oxide is oxidized an inverse point can form which tends to cause field enhancement. Oxide 1101 can also be formed by only thermal oxidation which would in turn leave only about 250 Angstroms on the exposed portions of substrate 901 because doped polysilicon will oxidize faster than the lightly doped crystalline silicon. Next, a second layer of polysilicon 1102 is deposited on the surface of the wafer to a preferred thickness of 2000 Angstroms. Then an oxide layer 1103 is formed on top of polysilicon 1102 to a preferred thickness of 400 Angstroms. Then silicon nitride (nitride) 1104 is deposited on top of oxide 1103 to a preferred thickness of 500 to 1000 Angstroms.

Figure 12:
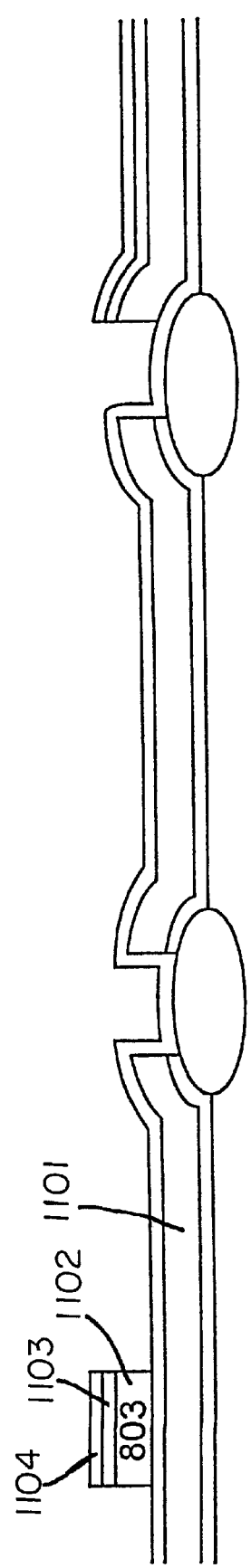
FIG. 12 is a cross section of a silicon substrate showing the remaining location of the oxide, nitride, and second polysilicon after these layers are etched.

Referring to FIG. 12, nitride 1104, oxide 1103, and polysilicon layer 1102 have been etched using traditional photolithography techniques to define the outer edges of erase control gate 803. Because each of these layers requires the use of different etchants, each layer is etched separately using dry etching.

Referring to FIG. 13, it is desired at this point to deposit a spacer oxide 1301 on the sides of the erase control gate 803. While the spacer oxide formation process is not shown in FIG. 13, it is known generally in the art and is explained only briefly. The spacer process preferably comprises depositing approximately 1000 to 2500 Angstroms of oxide or nitride over the structure in FIG. 12, and subjecting the deposited oxide or nitride to an anisotropic dry etch which occurs perpendicular to the substrate 901. This etch will preferentially etch away the oxide overlying horizontal surfaces while leaving a spacer oxide 1301 covering the vertical surfaces. After the etch, the spacer oxide 1301 will remain and will be about 75% as thick on the side of the erase control gate 803 as the original oxide or nitride film (e.g., 1000 to 2500 Angstroms in a preferred embodiment). Notice that the anisotropic etch is also used to remove interpoly oxide 1101 from the top of polysilicon 904. While the spacer oxide will also form on the vertical edges of the structures over field oxide 902, spacers in this location are unimportant and have not been drawn in FIG. 13.

Referring to FIG. 14, the exposed portions of polysilicon 904 can be anisotropically etched using the overlying erase control gate 803 and spacer oxide 1301 as a mask. This etching step defines the outer edges of floating gate 804, thus self aligning floating gate 804 underneath the erase control gate 803. It is desirable to dry etch the polysilicon such that nitride 1104 is not substantially thinned to protect oxide 1103 from being attacked during subsequent cleaning steps. Retaining a maximum amount of oxide 1103 is desirable to minimize coupling between erase control gate 803 and word line gate 801 which has yet to be formed. However, this is not required to successfully manufacture this cell and the nitride may instead be completely removed at this point. Note also that the remaining nitride must ultimately be removed prior to salacide formation or contact formation to be formed much later in the process flow.

Referring to FIG. 15, the remaining nitride 1104, oxide 1103, and polysilicon 1102 in the high voltage CMOS area are patterned and etched using traditional photolithography methods. As described with reference to FIG. 12, multi-step dry etching is used to remove these three materials individually. Notice that where polysilicon 1102 has been etched defines high voltage CMOS gates 1501. Notice also that interpoly oxide 1101 provides the gate oxide for high voltage CMOS transistor 1501.

Referring to FIG. 16, it is desired to protect the oxide 903 under the floating gate 804 from subsequent chemical processing which is described with reference to FIG. 17. This is referred to as edge sealing. To effectuate edge sealing, the cell is oxidized at this stage to form a thin layer of oxide 1601 on the sides of the floating gate 804 to a preferred thickness of 200 Angstroms. This oxide will grow to a lesser extent where oxides are already present and is shown in FIG. 16 only where it overlies a transistor structure. Because oxide layer 1601 will not be thick enough to adequately protect against subsequent chemical etching, it is desired to also put dielectric spacers 1602 on the sides of floating gate 804. The general processing steps to form spacers are well known in the art and are described with reference to FIG. 13. Dielectric spacers 1602 are also beneficial in that they will ultimately provide more insulation between floating gate 804 and erase control gate 803 from word line gate 801 which has not yet been formed. The spacers can be made several different ways with different potential advantages and drawbacks. Nitride spacers, while the cheapest from a manufacturing standpoint, may suffer from the drawback that during use the cell electrons may become trapped in the nitride spacer thus inadvertently hampering the ability of the device to form a channel. Therefore, if nitride spacers are used for dielectric spacer 1602, they should preferably be made as thinly as possible to leave 150 to 250 Angstroms of spacer on the side of the floating gate. Alternatively, an oxide spacer could be used. An acceptable oxide spacer can be achieved by oxidizing a pre-formed polysilicon spacer in a steam ambient. The thickness of the polysilicon spacer can be engineered such that it is completely oxidized when performing the subsequent high quality thermal oxidation process described with reference to FIG. 18, which would be approximately 150 Angstroms thick on the side of floating gate 804 prior to oxidation.

If it is inconvenient to optimize polysilicon deposition to match the subsequent oxidation step, the polysilicon can first be partially oxidized prior to the clean up described with reference to FIG. 17 that precedes the high quality thermal oxidation step. To implement this, approximately 300 Angstroms of polysilicon is left on the side of floating gate 804, which is then be partially oxidized leaving approximately 180 Angstroms of the polysilicon spacer unoxidized. During the subsequent clean up step, the oxidized portion of the spacer is removed, leaving the 180 Angstroms or so of unoxidized polysilicon spacer. This remaining portion of the polysilicon spacer is subsequently oxidized during the high quality oxidation process described with reference to FIG. 18. While the use of oxidized polysilicon spacers may be more expensive from a manufacturing standpoint, it is the presently preferred method because it can be expected to be superior in performance to nitride spacers; inadvertent trapping is minimized, while subsequent oxidation processes may be tailored independent of the edge sealing process described here. Although the dielectric spacers have been drawn in FIG. 16 such that they extend to the top of the vertical edges, they may in actuality extend only part of the way up the vertical edge; the dielectric spacers 1602 must extend at least far enough to cover the sides of the floating gate 804.

Referring to FIG. 17, all oxides that have been formed on the exposed surfaces of substrate 901 are removed using a diluted solution of hydrofluoric acid. Notice that the dielectric spacers 1602 protect the floating gate edge and the oxide underneath the floating gate from chemical attack while the oxide is completely removed from the single crystal silicon surface. This edge sealing process thus allows the growth of a thin high quality oxide on the exposed areas whose thickness is independent of that used under the floating gate.

Referring to FIG. 18, a high quality thermal oxide 1801 is grown on the wafer surface to a thickness which depends upon the desired thickness of the gate oxide to be employed in the low voltage CMOS oxide transistor. A typical range of thicknesses for oxide layer 1801 would be 90 to 100 Angstroms for 3.6V systems. Next a polysilicon layer 1802 is deposited on top of the thermal oxide 1801 to a preferred thickness of 2500 Angstroms.

Figure 19:
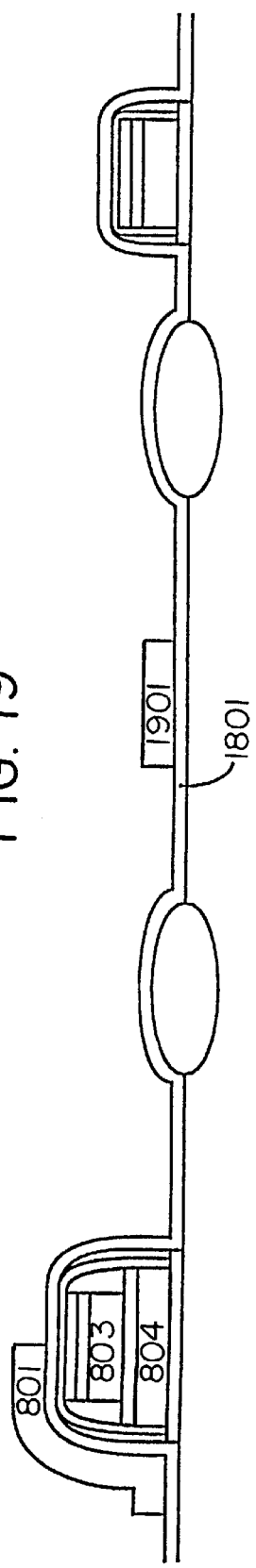
FIG. 19 is a cross section of a silicon substrate showing the remaining location of third polysilicon after etching.

Referring to FIG. 19, polysilicon layer 1802 is patterned and etched to define the outer edges of word line gate 801.

Notice that the low voltage CMOS transistor gate 1901 is also defined by the etching of polysilicon layer 1802 and that oxide 1801 provides the gate oxide for the low voltage CMOS transistor.

Figure 20:
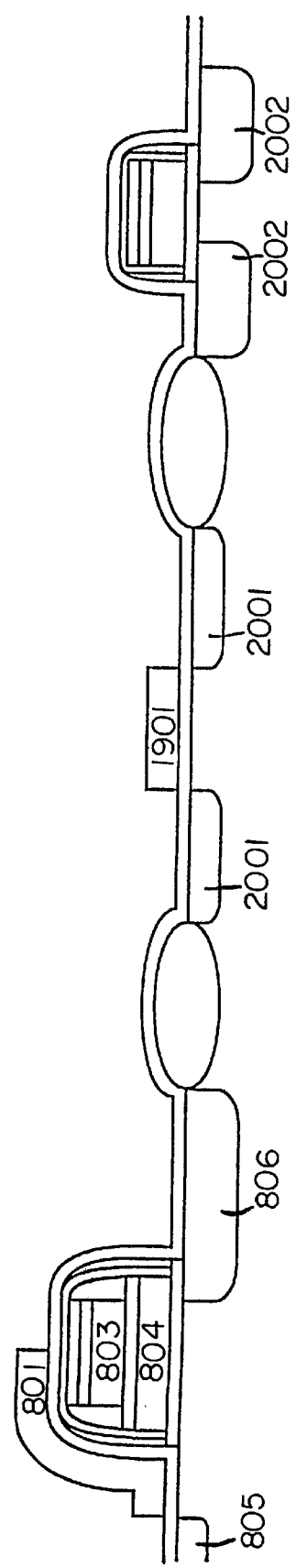
FIG. 20 is a cross section of a silicon substrate showing the position of the diffusion regions after ion implantation.

Referring to FIG. 20, standard processing techniques are used to form low voltage diffusions 2001 and high voltage diffusions 2002. This is accomplished using the same techniques described in the manufacture of the first embodiment with reference to FIG. 6. Where the low voltage diffusion appears adjacent to word line gate 801 it is referred to as bit line diffusion 805. Where the high voltage diffusion appears adjacent to floating gate 804 it is referred to as source diffusion 806. Once the formation of both low voltage diffusions 2001 and high voltage diffisions 2002 are completed, standard processing techniques are used to finish the manufacture of the device to make a fully functional circuit.

Figure 21:
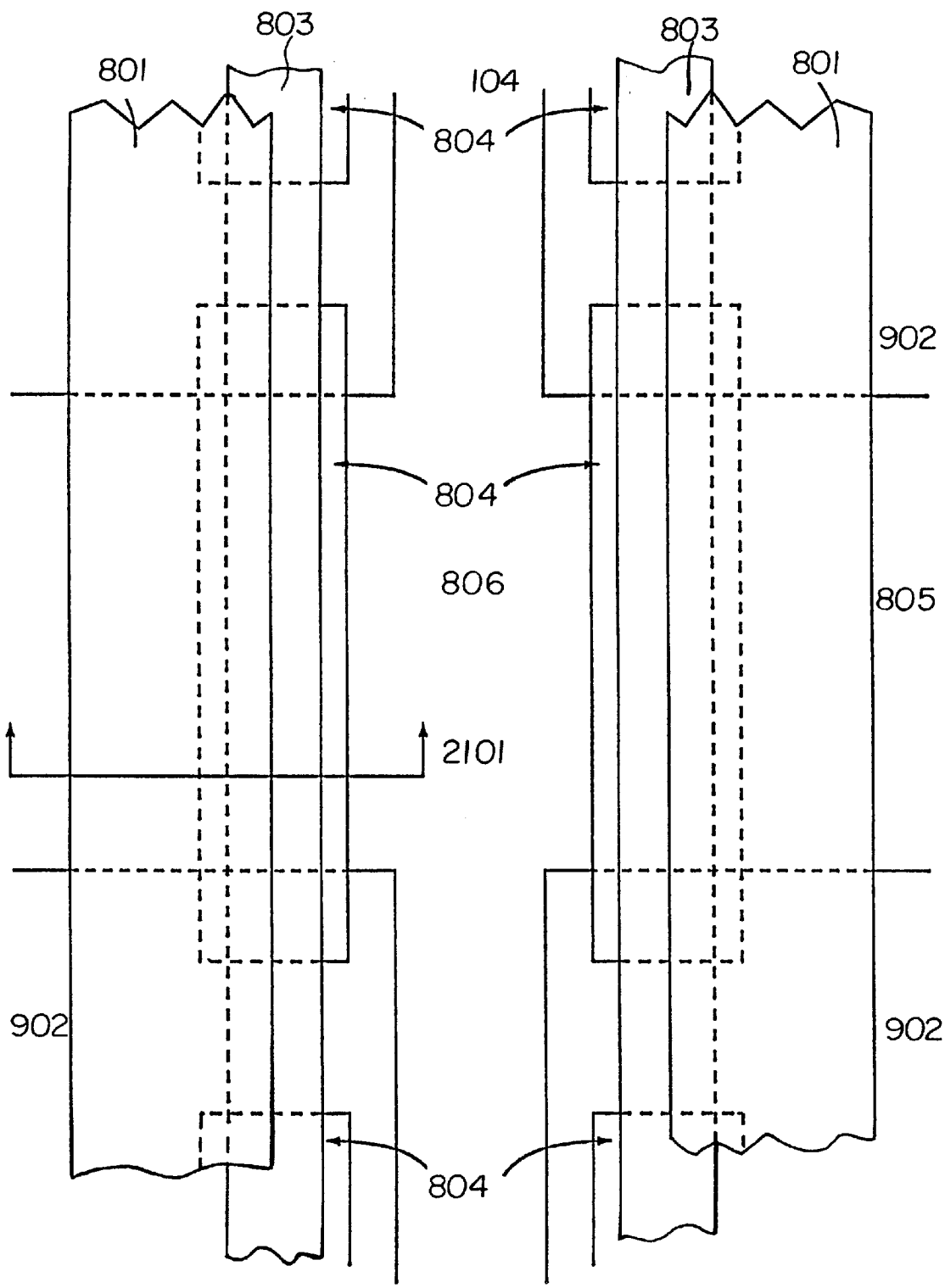
FIG. 21 is a planar view of two completed cells in an array after the processes described in FIGS. 9 through 20 have been completed.

FIG. 21 shows a top down view of two cells after performing the processes disclosed with reference to FIGS. 9 through 20. The cross sectional vantage point shown in FIG. 8 is denoted 2101. Potential advantages of the second embodiment are low costs of manufacture using a unique cell layout and a unique execution of standard CMOS manufacturing methods. The ability to control the floating gate to erase control gate coupling ratio is provided. the floating gate and erase control gate are made using a self-aligned process method that insures precise control of erase control gate coupling. An additional advantage is the independent control of all critical oxide thicknesses for transistors: floating gate, low voltage CMOS and high voltage CMOS. The layout and manufacturing methods will also support the optimization of the cell for interpoly erasure or erasure to the source.

Figure 22:
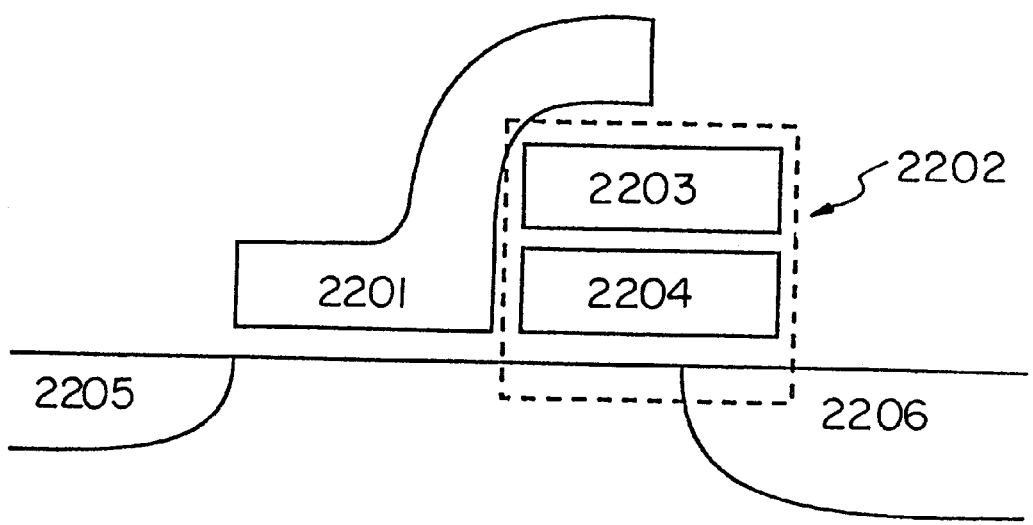
FIG. 22 is a cross section of a silicon substrate showing an embodiment of the claimed memory cell.

A third embodiment of memory cell in accordance with the present invention is shown in FIG. 22. The cell in FIG. 22 is comprised, as in the first embodiment, of two transistors in series, namely a word line gate transistor 2201 and a storage transistor 2202. Storage transistor 2202 further consists of an erase control gate 2203 and a floating gate 2204. Diffused regions appear on the outside edges of the two transistors which constitute a bit line diffusion 2205 and a source diffusion 2206. The memory cell shown in FIG. 22 can be made by executing the sequence of steps disclosed with reference to FIGS. 23 through 33.

Figure 23:
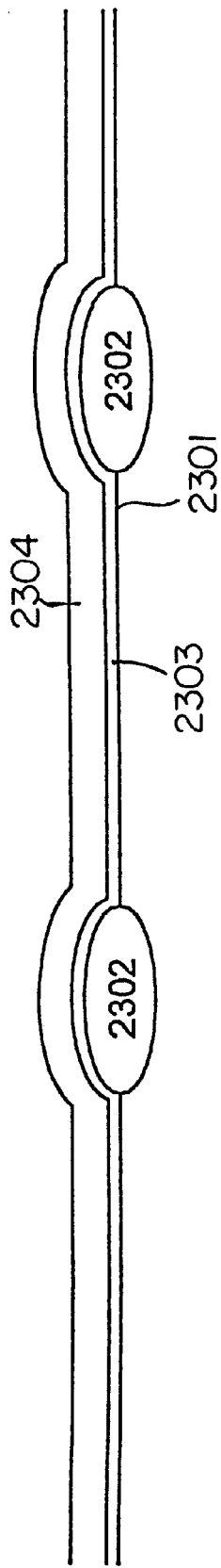
FIG. 23 is a cross section of a silicon substrate showing the resulting structure after first polysilicon deposition.

Referring to FIG. 23, field oxide regions 2302 are thermally grown in a lightly p-doped silicon crystalline substrate 2301. A high quality thermal oxide 2303 is grown on the wafer surface to a preferred thickness of 100 to 120 Angstroms. Then a first layer of polysilicon 2304 is deposited on the wafer surface to a preferred thickness of 500 Angstroms.

Figure 24A:
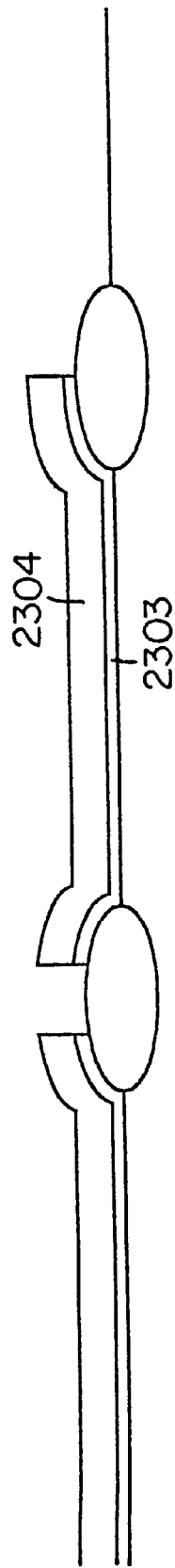
FIG. 24A is a cross section of a silicon substrate showing the remaining location of first polysilicon after etching.
Figure 24B:
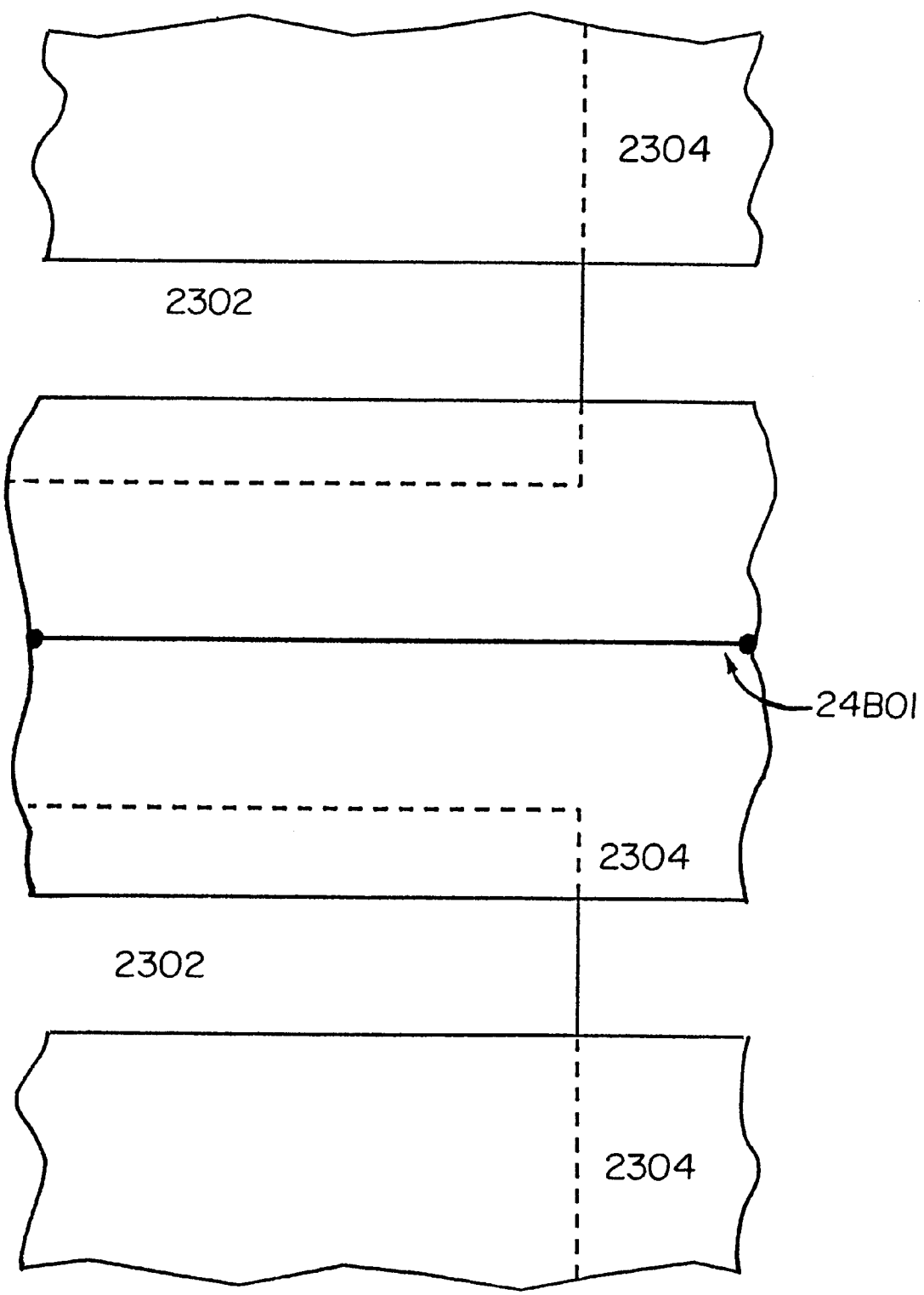
FIG. 24B is a planar view of the structure shown in cross section in FIG. 24A.

Referring to FIG. 24A, polysilicon 2304 is patterned and etched using traditional photolithography methods. Referring to FIG. 24B, a top view is shown of the cross sectional structure shown in FIG. 24A, which is marked by vantage point 24B01. Notice that polysilicon layer 2304 has had slots etched into it where it lies over oxide 2302 in the array by the photolithography step described with reference to FIG. 24A.

Figure 25:
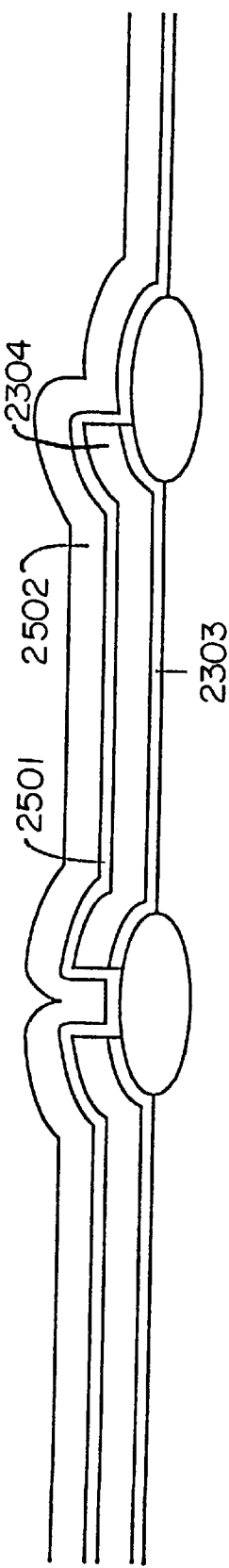
FIG. 25 is a cross section of a silicon substrate showing the resulting structure after second polysilicon deposition.

Referring to FIG. 25, the wafer is cleaned and a high quality thermal interpoly oxide 2501 is grown on the surface of the wafer to a preferred thickness of 200 through 400 Angstroms. A deposited oxide, oxynitride, or an oxide-nitride-oide sandwich may also be used for oxide 2501. Then a second layer of polysilicon 2502 is deposited on the surface of the wafer to a preferred thickness of 2000 Angstroms.

Figure 26:
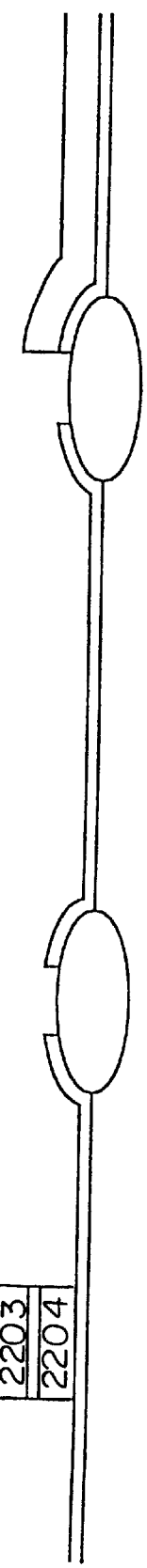
FIG. 26 is a cross section of a silicon substrate showing the resulting structure after the second polysilicon, interpoly oxide, and first polysilicon are etched.

Referring to FIG. 26, polysilicon layer 2502 is patterned and etched along with underlying interpoly oxide 2501 and polysilicon layer 2304 are anisotropically etched. It is preferred to etch polysilicon 2502, interpoly oxide 2501 and polysilicon 2304 individually using a dry plasma etch. Notice that this etching step defines the outer edges of both floating gate 2204 and erase control gate 2203. Notice also that the peripheral areas which will eventually contain the high voltage CMOS transistors are protected during the etching processes by photoresist during this patterning and etching process.

Figure 27:
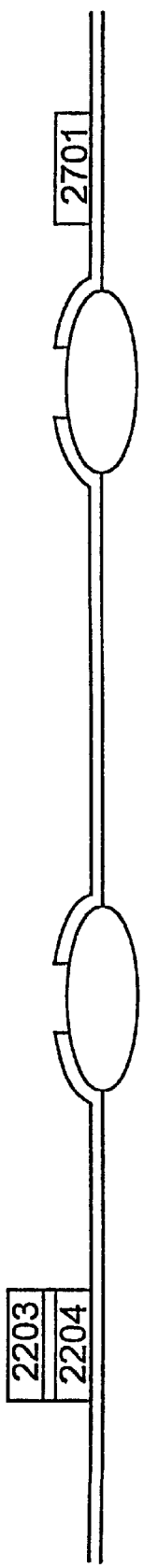
FIG. 27 is a cross section of a silicon substrate showing the resulting structure after the second polysilicon is etched to define the high voltage transistor gates.

Referring to FIG. 27, polysilicon layer 2502 is patterned and etched to form a high voltage CMOS transistor gate 2701. Interpoly oxide 2501 provides the gate oxide for the high voltage CMOS transistor 2701. The array area transistors are protected by photoresist during this patterning and etching process.

Figure 28:
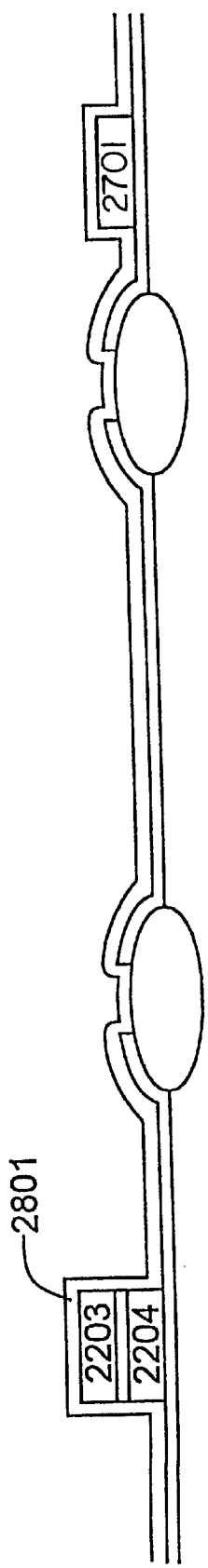
FIG. 28 is a cross section of a silicon substrate showing the resulting structure after thermal oxidation.

Referring to FIG. 28, a thermal oxide 2801 is grown on the surface of the wafer to a preferable thickness of 250 through 500 Angstroms. It is preferred to grow the oxide in a steam ambient as this will reduce the amount of time that the device spends at higher temperatures.

Referring to FIG. 29, dielectric spacers 2901 have been formed on the sides of floating gate 2204. This process is the same as is used in the second embodiment described with reference to FIG. 16.

Referring to FIG. 30, all oxides that have formed on the exposed surfaces of substrate 2301 are removed using a diluted solution of hydrofluoric acid. Dielectric spacers 2901 protect the floating gate edge from chemical attack.

Figure 31:
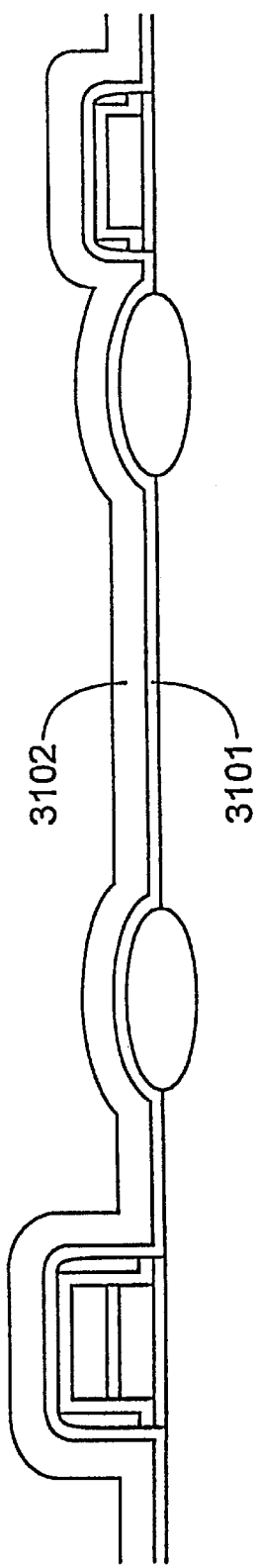
FIG. 31 is a cross section of a silicon substrate showing the resulting structure after third polysilicon deposition.

Referring to FIG. 31, a high quality thermal oxide 3101 is grown on the surface of the wafer to a preferred thickness of 90 Angstroms. Then, a third layer of polysilicon 3102 is deposited on the wafer to an appropriate thickness of approximately 2000 to 2500 Angstroms.

Figure 32:
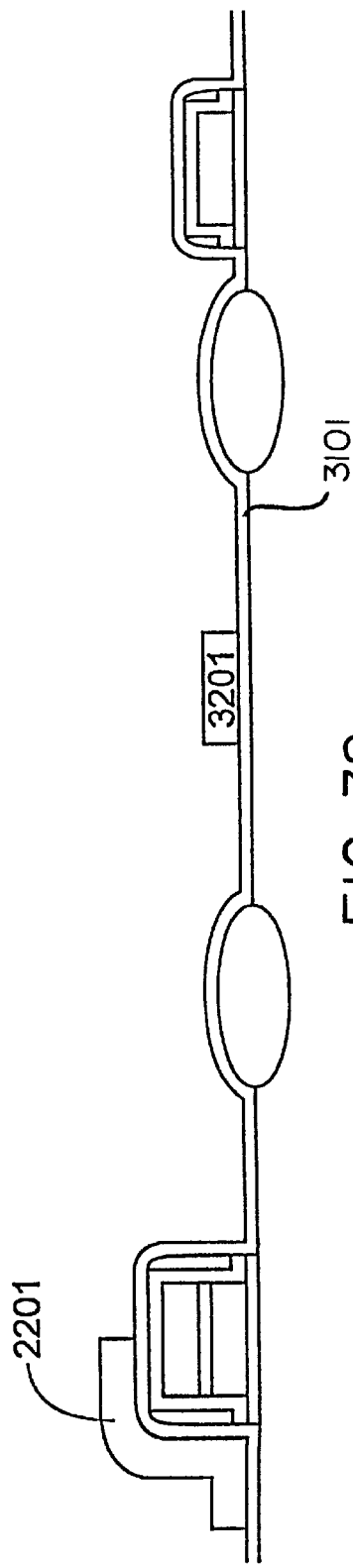
FIG. 32 is a cross section of a silicon substrate showing the remaining location of third polysilicon after etching.

Referring to FIG. 32, polysilicon 3102 is patterned and etched in accordance with standard photolithography techniques. This etch defines the word line gate 2201. Low voltage CMOS transistor gate 3201 is also defined by the etching of polysilicon 3102, and oxide 3101 forms the gate oxide for the low voltage CMOS transistor.

Figure 33:
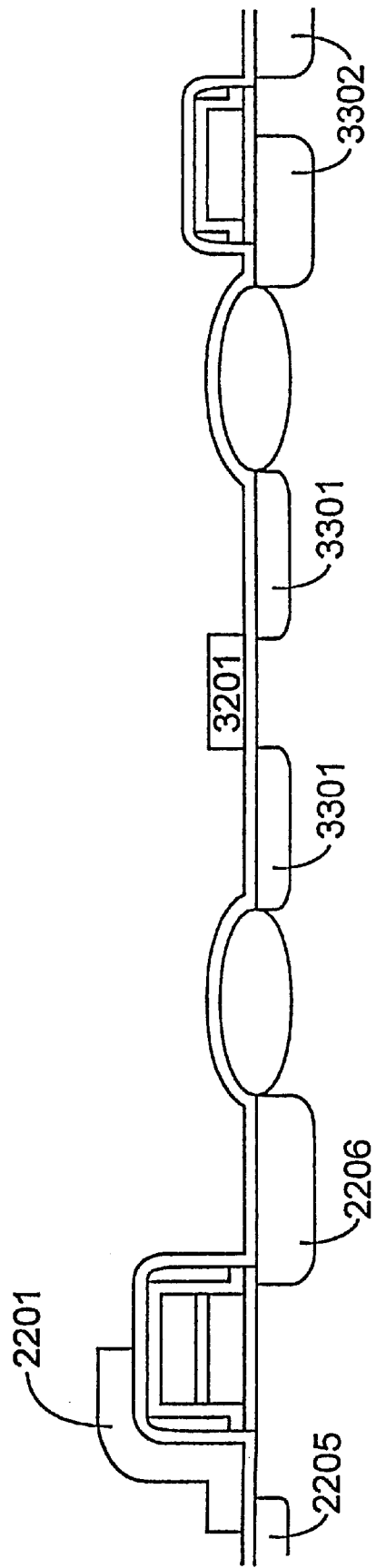
FIG. 33 is a cross section of a silicon substrate showing the position of the diffusion regions after ion implantation.

Referring to FIG. 33, standard processing techniques are used to form low voltage diffusions 3301 and high voltage diffusions 3302. This accomplished using the same techniques described in the manufacture of the first embodiment with reference to FIG. 6. Where the low voltage diffusion appears adjacent to word line gate 2201 it is referred to as bit line diffusion 2205. Where the high voltage diffusion appears adjacent to floating gate 2204 it is referred to as source diffusion 2206. Once the formation of both the low voltage diffusions 3301 and high voltage diffusions 3302 are completed, standard processing techniques are used to finish the manufacture of the device to make a fully functional circuit.

Figure 34:
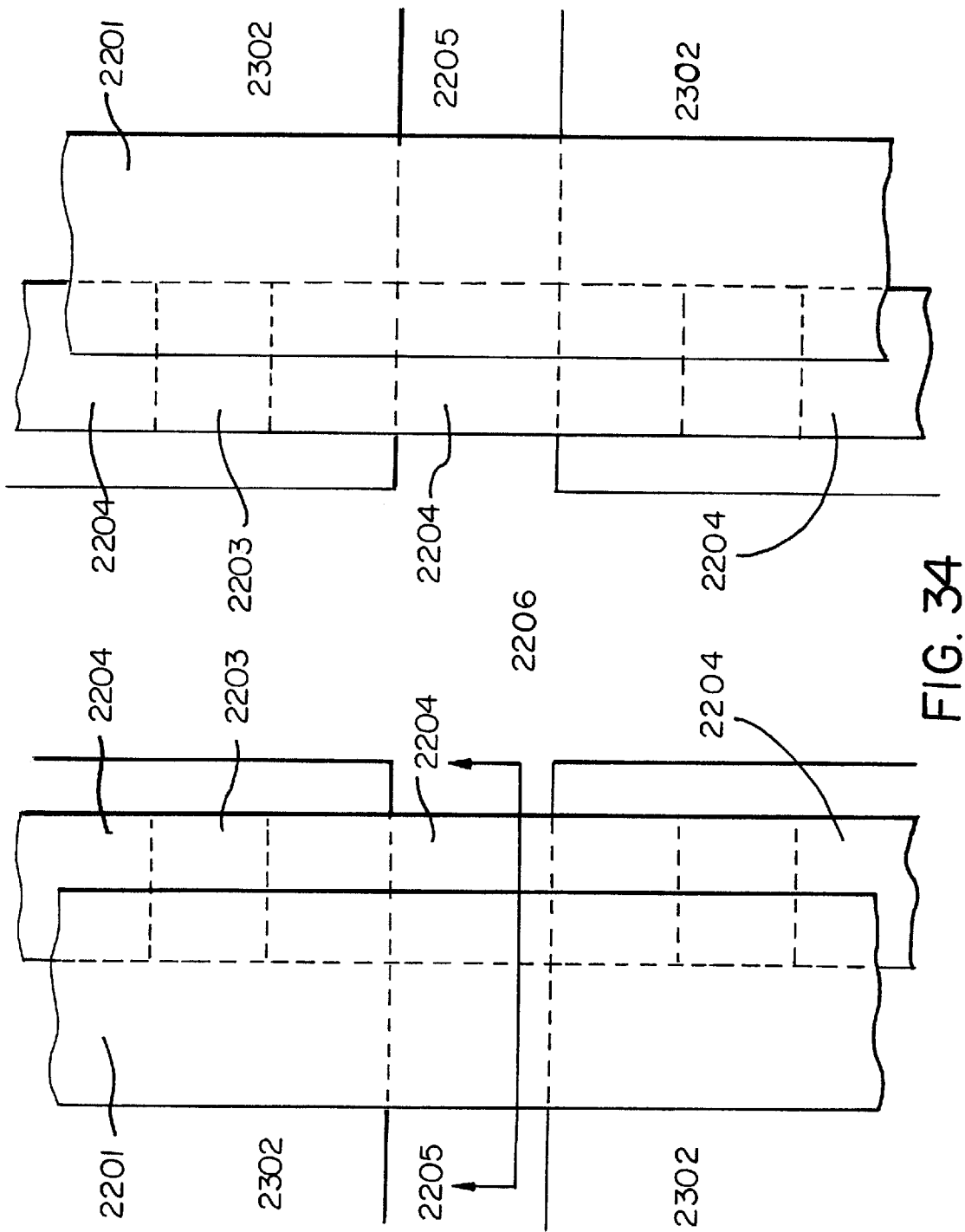
FIG. 34 is a planar view of two completed cells in an array after the processes described in FIGS. 23 through 33 have been completed.

FIG. 34 shows a top down view of two cells after performing the processes described with reference to FIGS. 23 through 33. The cross sectional vantage point shown in FIG. 22 is denoted 3401. Advantages of the third embodiment include low cost manufacture of a high performance three gate cell using a unique cell layout and unique execution of standard CMOS manufacturing methods. Also, the floating gate and erase control gate are made in a self aligned process that insures that the floating gate and erase gate are the same size. Moreover, the second embodiment supports low risk salacide formation on both the source and drain of the device. Source resistance is greatly reduced if salacide formation is allowed on the source which improves overall circuit performance. Furthermore, the processing costs are lower than the second embodiment previously described. Also, like the second embodiment, this embodiment allows for independent oxide control for all critical thin oxides: floating gate oxide, low voltage CMOS oxide, and high voltage CMOS oxide.

Figure 35:
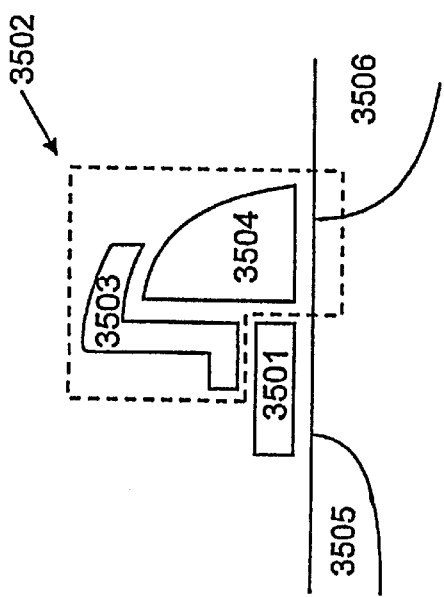
FIG. 35 is a cross section of a silicon substrate showing an embodiment of the claimed memory cell.

A fourth embodiment of a memory cell in accordance with the present invention is shown in FIG. 35. The cell in FIG. 35 is comprised, as in the first embodiment, of two transistors in series, namely a word line gate transistor 3501 and a storage transistor 3502. Storage transistor 3502 further consists of an erase control gate 3503 and a floating gate 3504. Diffused regions appear on the outside edges of the two transistors which constitute bit line diffusion 3505 and source diffusion 3506. The memory cell shown in FIG. 35 can be made by executing the sequence of steps disclosed with reference to FIG. 36 through 44.

Figure 36:
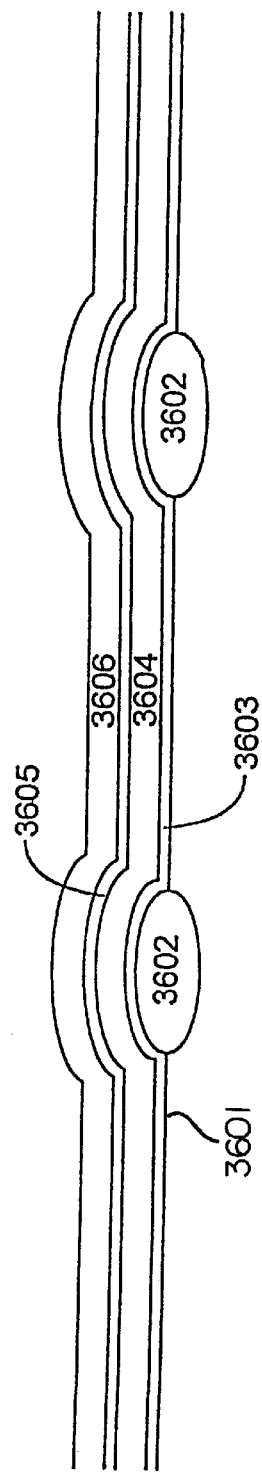
FIG. 36 is a cross section of a silicon substrate showing the resulting structure after growth of a thermal oxide and the deposition of first polysilicon, oxide, and nitride.

Referring to FIG. 36, field oxide regions 3602 are thermally grown in a lightly p-doped silicon crystalline substrate 3601. A high quality thermal oxide 3603 is grown on the wafer surface to a thickness which depends upon the desired thickness of the gate oxide to be employed in the low voltage CMOS transistors. A typical preferred thickness for oxide 3603 would be 90 Angstroms for 3.3V operation. Then a first layer of polysilicon 3604 is deposited on the wafer surface to a preferred thickness of 2000 to 3000 Angstroms. Next an oxide 3605 is deposited on top of the polysilicon 3604 to a preferable thickness of 500 to 1000 Angstroms. Next a silicon nitride 3606 is deposited on top of the oxide 3605 to a thickness which will ultimately depend on the desired amount of coupling between erase control gate 3503 and floating gate 3504, which win be formed in later steps. A nominal thickness for nitride 3606 would be 2000 Angstroms. A thicker nitride 3606 would produce higher coupling by ultimately increasing the overlap area between erase control gate 3503 and floating gate 3504.

Referring to FIG. 37, nitride 3606, oxide 3605, and polysilicon 3604 are patterned and etched using traditional photolithography techniques leaving the structure shown. Note that the etching of nitride 3606, oxide 3605, and polysilicon 3604 are preferably performed using distinct etchants to remove these layers one at a time. Where the polysilicon 3604 is etched defines the outer edges of word line 3501 and low voltage CMOS transistor gate 3701.

Referring to FIG. 38, an oxide 3801 is thermally grown on the sides of polysilicon 3604 to a preferred thickness of 100 Angstroms. Nitride 3606 will not oxidize and thus oxide 3801 is not present on it. Next, dielectric spacers 3802 are formed on the sides of word line 3501 and overlying layers. This process is the same as is used in the second embodiment described with reference to FIG. 16.

Referring to FIG. 39, all oxides that have formed on the exposed surfaces of substrate 3601 are removed using a diluted solution of hydrofluoric acid. Dielectric spacers 3802 protect the floating gate edge from chemical attack.

Referring to FIG. 40, a high quality thermal oxide 4001 is grown on the surface of the wafer to a preferred thickness of 100 through 150 Angstroms. Oxide 4001 will contact the oxide underneath the floating gate 3504. Nitride 3606 will not oxidize and thus oxide 4001 is not present on it. Next, a second polysilicon layer 4002 is deposited on the wafer surface to a preferred maximum thickness of 4000 Angstroms. Polysilicon layer 4002 will be used to form a floating gate which is self aligned to the word line gate 3501.

Figure 41A:
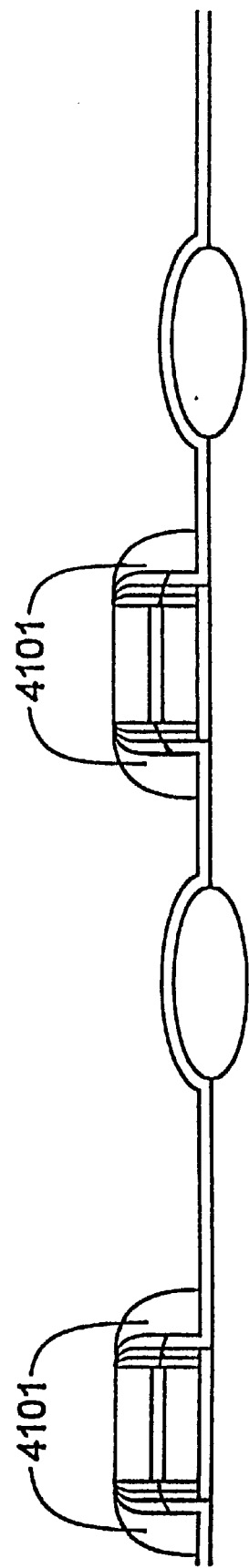
FIG. 41A is a cross section of a silicon substrate showing the resulting structure after the formation of polysilicon spacers.
Figure 41B:
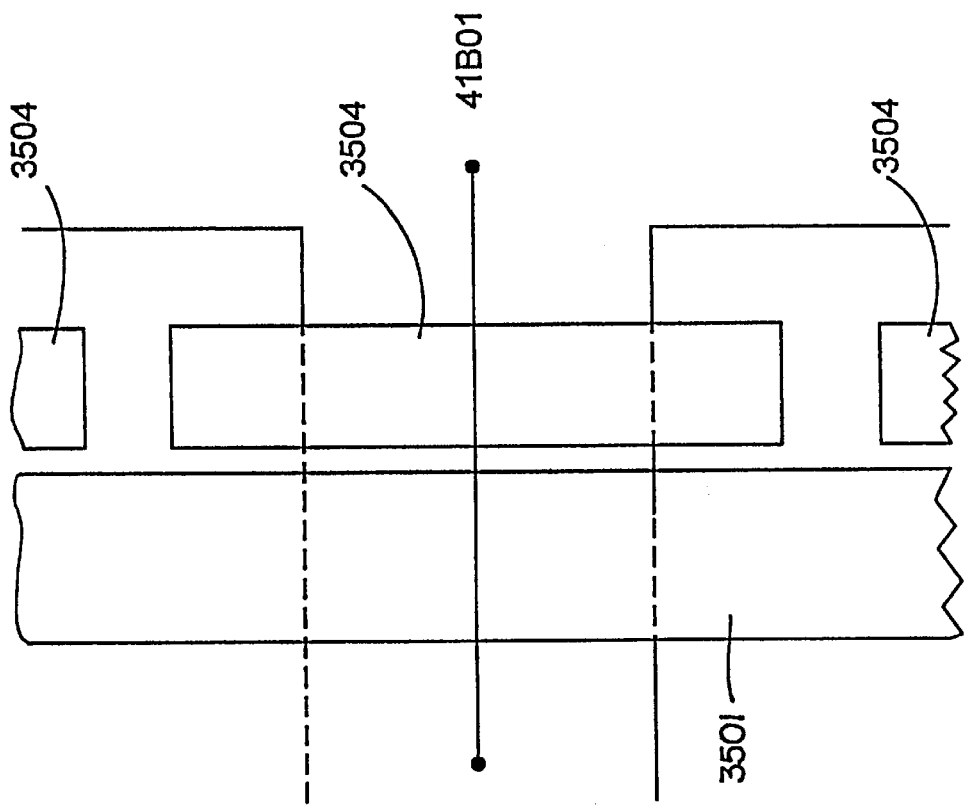
FIG. 41B is a planar view of the structure shown in cross section in FIG. 24A after portions of the polysilicon spacers have been removed by etching.
Figure 41C:
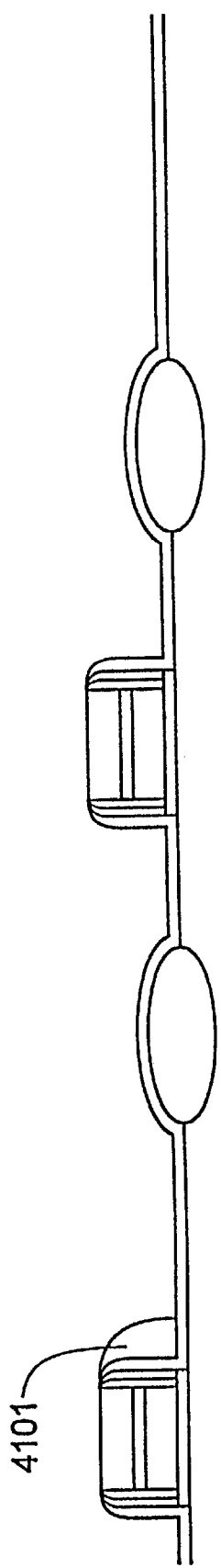
FIG. 41C is a cross section of a silicon substrate of the structure shown in FIG. 41B.

Referring to FIG. 41A, the second polysilicon 4002 is anisotropically etched to form polysilicon spacers 4101 which will ultimately act as the floating gate 3504. Next, portions of the remaining polysilicon spacers are masked and etched using well known lithography techniques. Referring to FIG. 41B, a top down view shows the location of word line 3501 and those portions of polysilicon spacers 4101 that remain after this second masked spacer etch. After the etch is completed and the photoresist removed, the cross section of the cell taken from vantage point 41B01 is shown in FIG. 41C. Notice that the effect of the etch is to remove to polysilicon spacers 4101 where they are not desired (e.g., on one half of the cell and from the sides of the voltage CMOS transistors 3701) and also to define the third and fourth sides of floating gate 3504 as seen in FIG. 41B.

Figure 42:
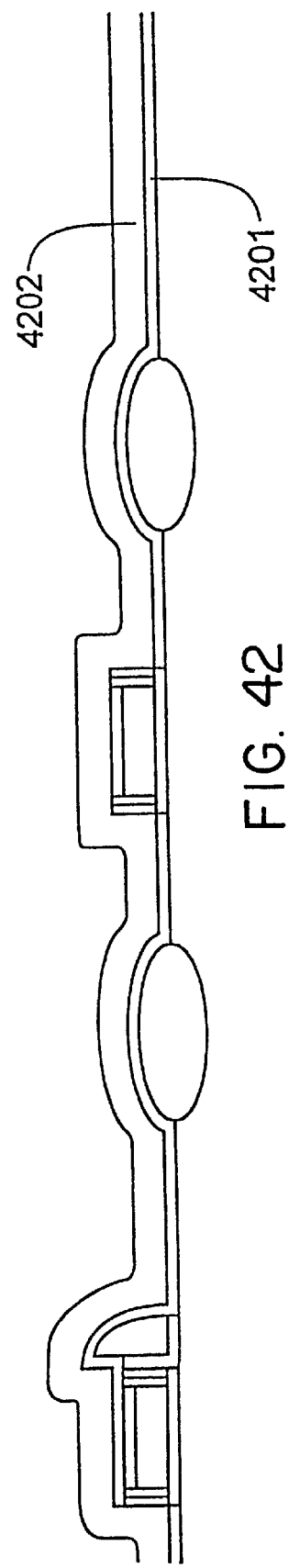
FIG. 42 is a cross section of a silicon substrate of the resulting structure after third polysilicon deposition.

Referring to FIG. 42, the remaining nitride 3606 is removed using hot phosphoric acid. Next, the wafer is cleaned and an interpoly oxide 4201 is grown or deposited by CVD on the surface of the wafer to a preferred thickness of 300 Angstroms. Notice that in this embodiment the edge seal techniques used in the second and third embodiments are not required because the interpoly oxide will be substantially thicker than the oxide already present on the wafer. Next, a third layer of polysilicon 4202 is deposited on the surface of the wafer to a preferred thickness of 2500 Angstroms.

Figure 43:
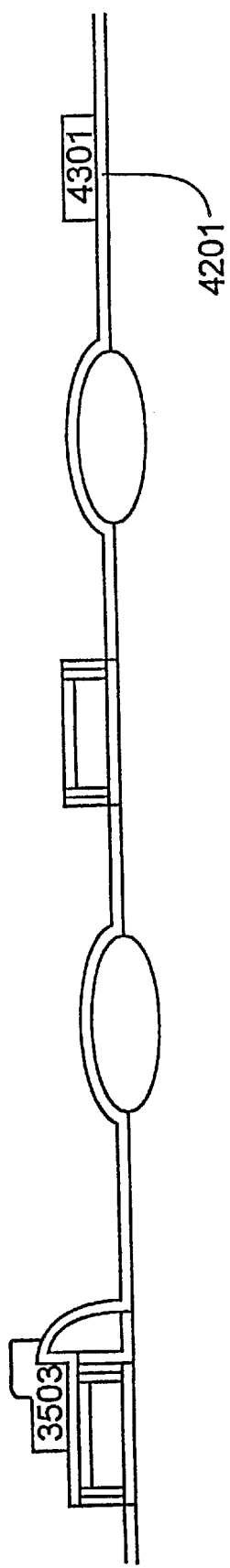
FIG. 43 is a cross section of a silicon substrate showing the remaining location of third polysilicon after etching.

Referring to FIG. 43, third polysilicon layer 4202 is patterned and etched to define the outer edges of erase control gates 3503. High voltage CMOS transistor gate 4301 is also defined by the etching of polysilicon 4202 and interpoly oxide 4201 provides the gate oxide for high voltage transistor 4301.

Figure 44:
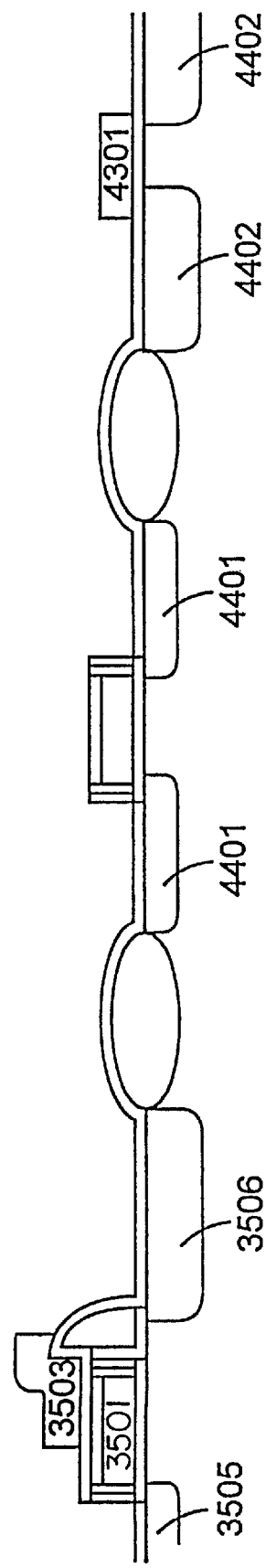
FIG. 44 is a cross section of a silicon substrate showing the position of the diffusion regions after ion implantation.

Referring to FIG. 44, standard processing techniques are used to form low voltage diffusions 4401 and high voltage diffusions 4402. This accomplished using the same techniques described in the manufacture of the first embodiment with reference to FIG. 6. Where the low voltage diffusion appears adjacent to word line gate 3501 it is referred to as bit line diffusion 3505. Where the high voltage diffusion appears adjacent to floating gate 3504 it is referred to as source diffusion 3506. Once the formation of both low voltage diffusions 4401 and high voltage diffusions 4402 are completed, standard processing techniques are used to finish the manufacture of the device to make a fully functional circuit.

Figure 45:
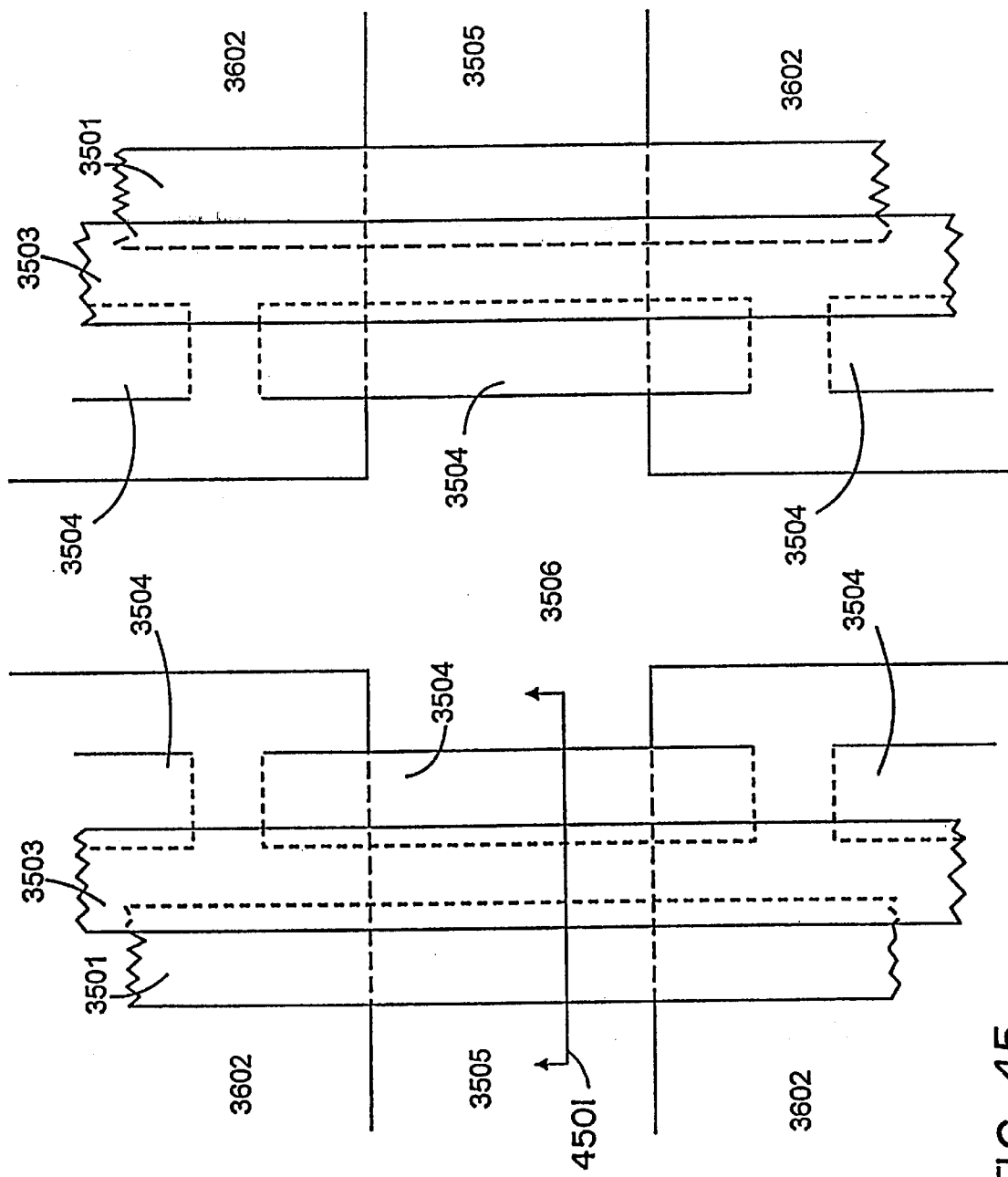
FIG. 45 is a planar view of two completed cells in an array after the processes described in FIGS. 36 through 44 have been completed.

FIG. 45 shows a top down view of two cells after performing the processes described with reference to FIGS. 36 through 44. The cross sectional vantage point shown in FIG. 35 is denoted 4501. Advantages of the fourth embodiment include: compatibility with deep sub-micron CMOS manufacturing methods and therefore scalability to achieve very high density layouts; the word line gate and the floating gate are self aligned to eliminate changes in read channel length from layer to layer misalignment; the floating gate size may be controlled with extreme precision due to the novel manufacturing method described; the cell has the smallest size and ease of scaling to very small dimensions when compared to other embodiments; and optional steps allow additional control of the area of the floating gate to erase gate coupling across the interpoly oxide.

One of ordinary skill in the art of semiconductor processing will realize that there are many different ways to effectuate and optimized the embodiments described. For example, it may be beneficial prior to diffusion formation to form a spacer or sidewall oxide on the sides of the polysilicon for the purposes of reducing short channel effects and protecting the gate oxide layer from ion implant damage. The high quality dielectric used as gate oxides or as inter-poly oxides could be made of thermal oxide, nitrided oxides, oxynitride, or even oxide-nitride sandwiches of various sorts. One of ordinary skill will also recognize that the polysilicon is generally doped either after deposition or during deposition for the purpose of decreasing the polysilicon's resistance and thus promoting faster signal transmission through these layers. In some cases, this will quicken the rate of oxidation of these layers when compared to the rate of growth on the lightly doped crystalline substrate. Also, silicidation processes may be used to form a metallic silicide or salicide over exposed polysilicon and diffusion regions for the purpose of promoting faster signal transmission through these layers. Furthermore, one of normal skill in the art will recognize that the various coupling requirements that are important to optimize cell performance, which will be described in detail later, can be affected during processing by changing dielectric thicknesses, dielectric constants, overlap areas, and generally by optimizing the alignment of the various gates with respect to one another.

Figure 46A:
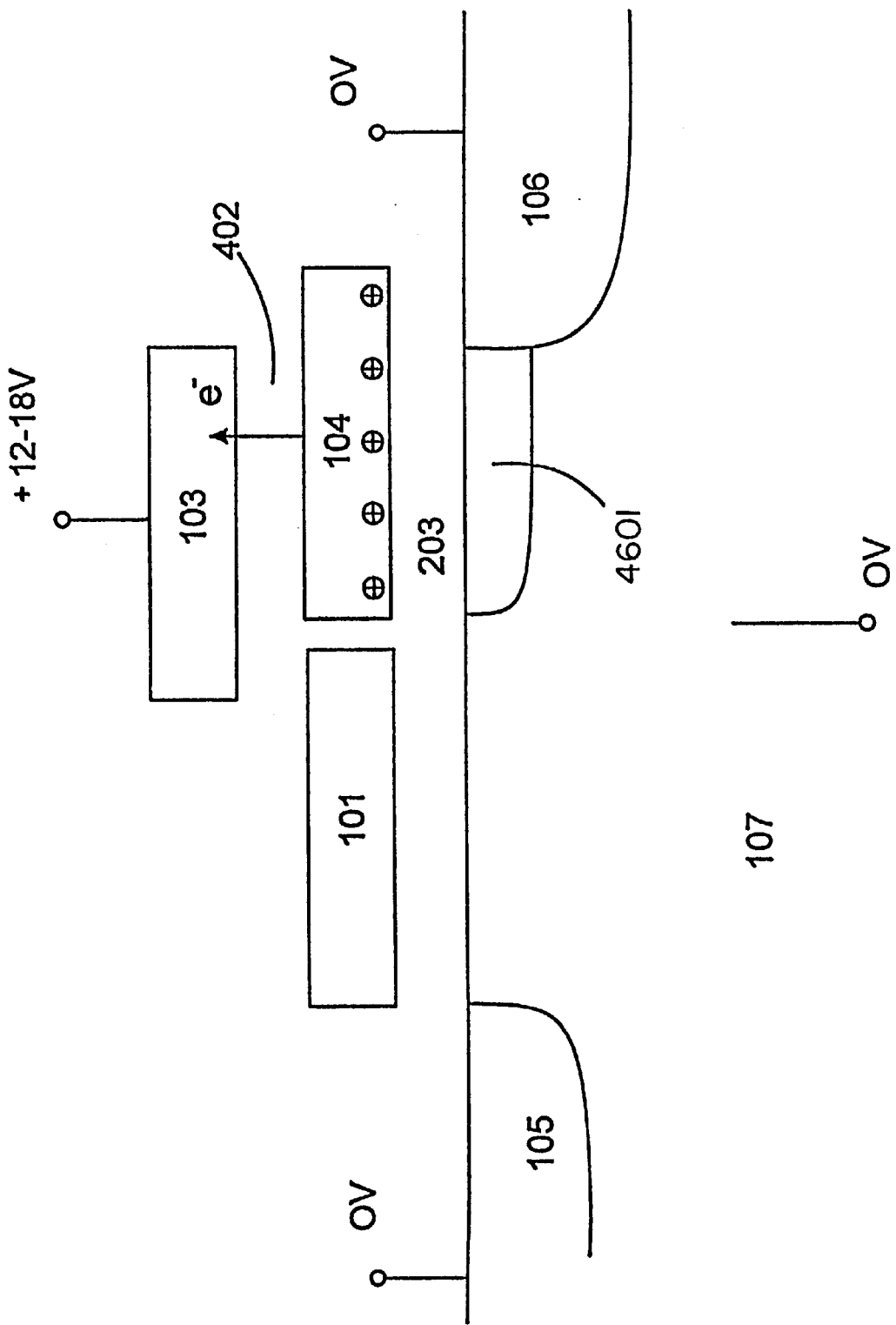
FIG. 46A is a cross section of a silicon substrate showing an embodiment of the claimed memory device and the biasing conditions that can be used to erase the device by causing charges to move through the interpoly oxide.

Operating principles of devices in accordance with the present invention will now be described in reference to the first embodiment as described with reference to the cross section of FIG. 1. FIG. 46A shows the conditions that can be applied to the cell to erase the cell. Erasure is accomplished by applying a positive bias to the erase control gate 103 the range of twelve to eighteen volts while holding substrate 107, bit line diffusion 105, and source diffusion 106 at ground. The interpoly oxide 402 thickness, oxide 203 thickness, and the geometric arrangement of the overlap of floating gate 104 and erase control gate 103 are chosen to allow the floating gate potential to tightly couple to ground relative to the erase gate. Thus, an effective electric field of about 8.5 megavolts/centimeter can be applied across interpoly oxide 402 during erasure. This high electric field allows electrons to tunnel via Fowler-Nordheim mechanics through interpoly oxide 402 from floating gate 104 to erase control gate 103. Using these conditions it will take anywhere in the range of one to 100 milliseconds to fully erase the cell.

One of ordinary skill in the art will realize that erase time can be reduced in several ways. First, the polysilicon surfaces of floating gate 104 can be made rough where it is in contact with the interpoly oxide 402. This can be accomplished by adjusting the polysilicon deposition and doping conditions to change the resulting polysilicon grain sizes in the film that constitutes the floating gate 104. These asperites at the floating gate 104/interpoly oxide 402 interface will enhance the effective electric field in the interpoly oxide, thus facilitating erasure. Second, the thickness of the interpoly oxide may be reduced to accentuate the electric field in that film, thus facilitating erasure. Of course, if the oxide is made too thin, oxide reliability problems may result, such as oxide breakdown or unwanted charge transfer from the floating gate during the reading operation. Third, proper geometric arrangement of the three gates with respect to one another may affect the coupling to produce a lower coupled voltage on floating gate 104 and thus a higher voltage and field across the interpoly oxide which would facilitate erasure. Likewise, changing any of theses factors may also make it possible to lower the voltages needed to accomplish erasure in a reasonable amount of time. These details will be embellished upon below.

After erasure, floating gate 104 is left with a net positive charge which is suitable to provide for channel inversion 4601 in the silicon underneath floating gate 104 such that storage transistor 102 is normally "on" even absent a potential on the erase control gate. One of ordinary skill in the art will realize that the disclosed biasing conditions are not the only way that erasure can be effectuated and that different biasing schemes can similarly achieve the desired result of leaving floating gate 104 with a net positive charge after erasure. For example, the device may also be erased by Fowler-Nordheim tunneling of electrons through oxide 203 below the floating gate 104, through the application of a high voltage to source diffusion 106. (FIG. 46B) Indeed, source side erasure is a very popular technique in current Flash EPROM technologies. However, unlike Flash cells employing source side erasure, the claimed cell is not susceptible to overerasure because it envisions erasure resulting in a net positive charge being left on the floating gate. Such a condition would cause a systems failure in a traditional source side erase flash cell.

Figure 47:
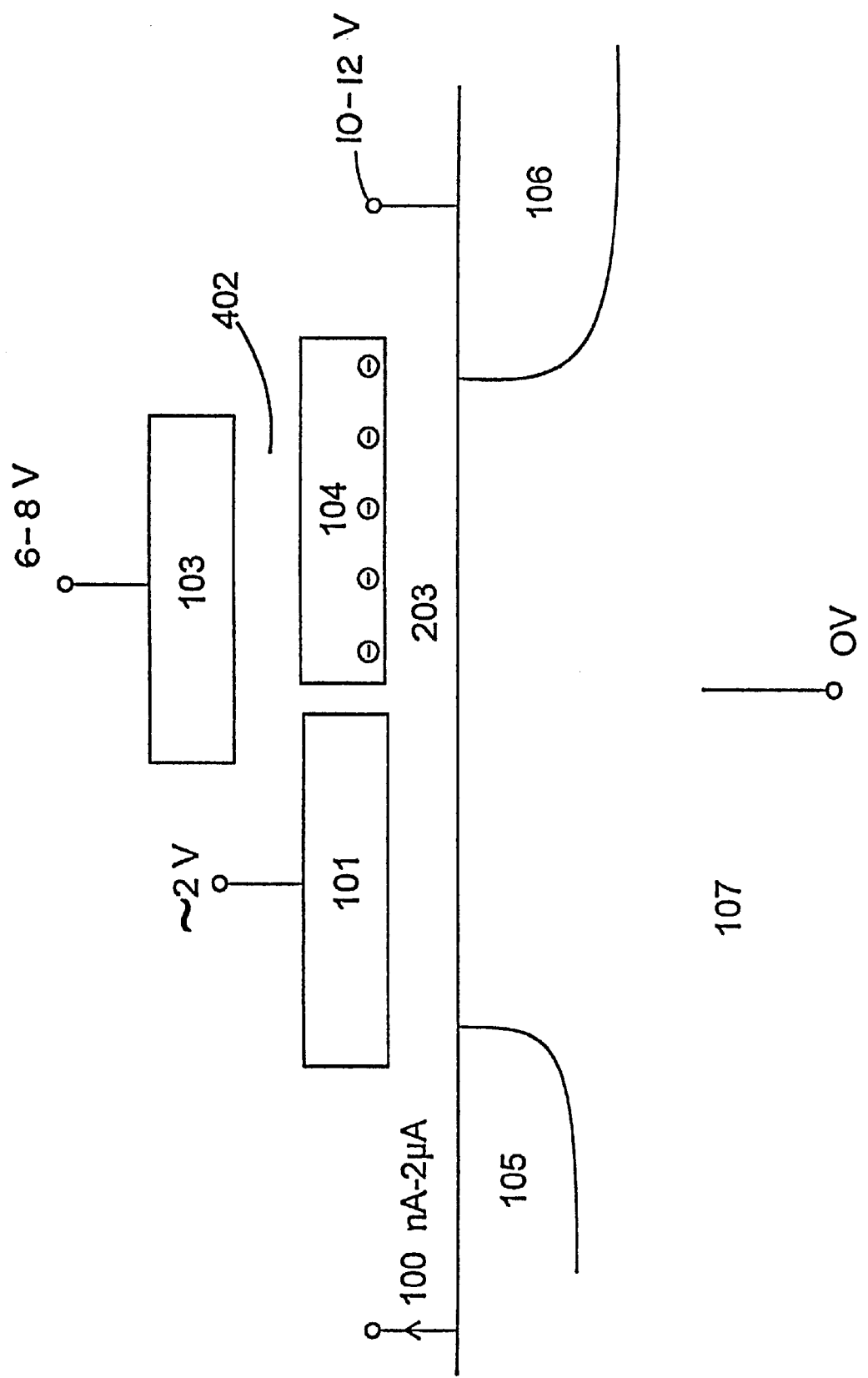
FIG. 47 is a cross section of a silicon substrate showing an embodiment of the claimed memory device and the biasing conditions that can be used to program the device.

FIG. 47 shows the conditions that can be applied to the cell to program the cell. Programming is accomplished by placing a high voltage on source diffusion 106 in the range of eleven to thirteen Volts, a moderately high voltage on erase control gate 103 in the range of six to eight Volts, and a relatively small voltage on word line gate 101 of about 2 Volts. Also, a current source is connected to bit line diffusion 105 which forces a current in the range of 100 nanoamperes to 2 microamperes. Substrate 107 is grounded. These biasing conditions create a strong lateral electric field in substrate 107 underneath floating gate 104 such that the electrons in that region become "hot." Because floating gate 104 is coupled to a positive potential, some portion of these hot electrons will be drawn onto floating gate 104 thus programming the cell. Using these biasing conditions it will take anywhere in the range of 25 microseconds to 100 millisecond to program the device. One of ordinary skill in the art will recognize that programming speed may be reduced or the applied voltage during programming may be reduced by improving the coupling of high voltages to the floating gate during programming. Several ways to effectuate this desired result are described below.

After programming, floating gate 104 will be left with a net negative charge which causes further accumulation of positive charge carriers in the silicon underneath to floating gate such that no channel can be formed in that region absent biasing of erase control gate 103. Thus, a programmed cell is normally "off." One of ordinary skill in the art will realize that the disclosed biasing conditions are not the only way that programming can be effectuated and that different biasing schemes can similarly achieve the desired result of leaving floating gate 104 after programming with a net positive charge. For example, the device may also be programmed by Fowler-Nordheim tunneling of electrons through oxide 203 below floating gate 104 through the application of a high voltage to erase control gate 103.

Figure 48:
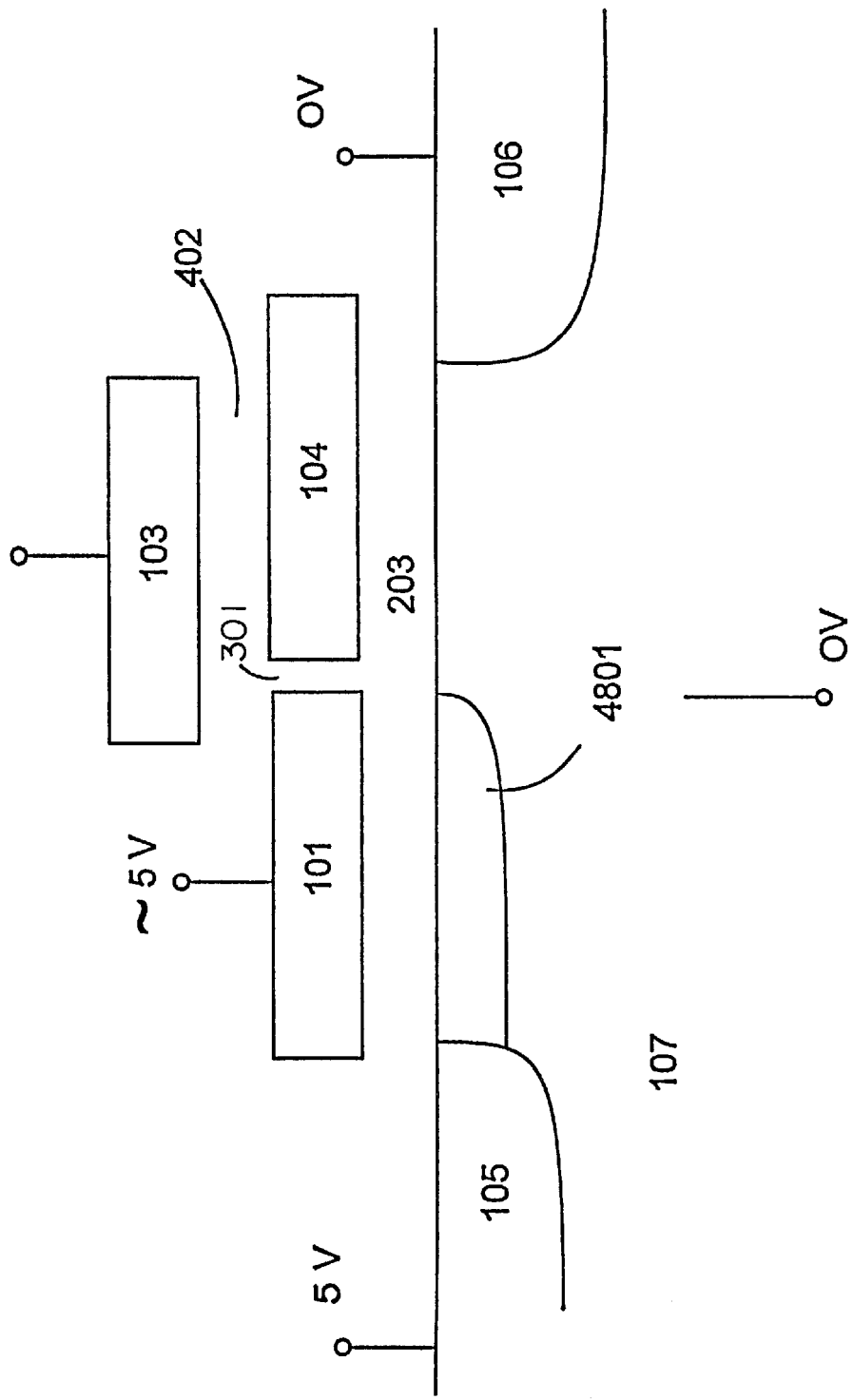
FIG. 48 is a cross section of a silicon substrate showing an embodiment of the claimed memory device and the biasing conditions that can be used to read the device.

The difference in current flow between the "on" or erased state and the "off" or programmed state is employed to define a logic one or zero. FIG. 48 shows the conditions that are used to read the device, i.e., to detect if current is flowing between bit line diffusion 105 and source diffusion 106 to thus determine if the bit is at a logic one (and therefore erased) or zero (and therefore programmed). Reading is accomplished by placing the chip's power supply voltage, usually 5 volts, on both word line gate 101 and bit line diffusion 105. Source diffusion 106 and substrate 107 are grounded. Because the threshold voltage of word line gate 101 is lower than the applied word line gate voltage, a channel 4801 will form in substrate 107 underneath word line gate 101. As noted above, if the bit is erased, a channel will already be formed underneath floating gate 104. Because gap 301 that separates the channel underneath word line gate 101 and the channel underneath floating gate 104 is thin, the two channels will touch, forming a single channel that now electrically connects bit line diffusion 105 to source diffusion 106. Thus, bit line diffusion 105 and source diffusion 106 are no longer electrically isolated from one another, a substantial current will flow between them giving rise to a logic one state. Conversely, if the device is programmed, no channel will form underneath floating gate 104, and in fact channel formation is impeded in this region due to the net negative charge that exists on floating gate 104. Thus, although a channel exists underneath word line gate 101, bit line diffusion 105 and source diffusion 106 will not be electrically connected and will remain substantially electrically isolated from one another such that substantially no current will flow giving rise to a logic zero state. One of ordinary skill in the art will realize that the disclosed biasing conditions are not the only way that reading can be effectuated and that different biasing schemes can similarly achieve the desired result of detecting whether current can flow between bit line diffusion 105 and source diffusion 106. Moreover, while the cross sectional figures in FIGS. 46A, 46B, 47, and 48 most closely resemble the first embodiment shown in FIG. 1, it should be clear to those of ordinary skill that the operational principles herein described will apply to all four embodiments.

Figure 49B:
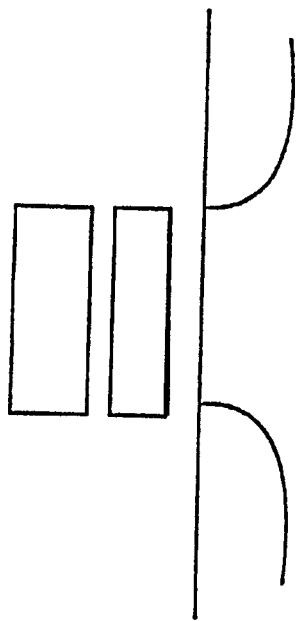
FIG. 49B is a cross section of a silicon substrate showing a prior art memory device called the "ETOX" cell.
Figure 49A:
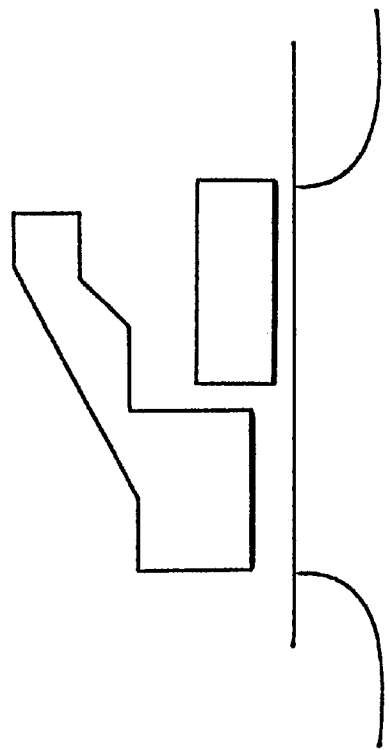
FIG. 49A is a cross section of a silicon substrate showing a prior art memory device called the "SST" cell.

The disclosed three gate cell is believed to offer significant advantages over the prior art in that the "on" state current is substantially higher than alternate Flash cell configurations. Two examples of prior art cells are shown in FIGS. 49A (the "SST" split gate cell) and 49B (the "ETOX" style cell). When comparing the SST and ETOX cell with the first embodiment of the claimed cell as disclosed in FIG. 1, it will be appreciated that a cell in accordance with the present invention allows for a much thinner gate oxide 203 to be used under word line 101. The word line gate in the claimed cell is never exposed to high voltages as is needed for programming and erasure of the SST and ETOX cells, thus allowing the word line gate oxide to be thinned without compromising oxide reliability. In the SST cell the oxide must remain relatively thick to withstand the higher voltages required for erasure. In the ETOX cell, because the word line gate is placed on top of the floating gate, the total effective oxide thickness between the word line gate and the substrate will again be thicker than is required underneath the word line in the claimed cell. The advantage of having a thinner oxide under the word line is that the claimed cell can achieve higher "on" state currents. The increased current allows the logic state of the cell to be determined more quickly by the sensing circuitry, and makes the claimed cell a better candidate over the prior art for high speed applications. Estimates of the SST and ETOX cell on state drive currents, based on the approximate oxide thicknesses used in those cells, shows that the relative on state currents for these cells is 0.4 units and 0.3 units respectively, compared with 0.77 for the claimed cell. This represents an increase in on state drive current of approximately 200% over the prior art.

Another advantage of a cell in accordance with the present invention is that it can be made to be compatible with the CMOS circuitry that will exist outside of the array of cells. As described with reference to FIGS. 2–6, several of the processing steps used in the formation of the array are also used to build both high voltage and low voltage CMOS transistors. Thus, the claimed cell is a good candidate for embedded flash applications where it is desired to leave the exiting CMOS processes substantially intact. It is estimated that when a three gate cell in accordance with the present invention is added to a conventional CMOS technology that there will be only about a 30% increase in manufacturing costs, depending of course on which of the embodiments disclosed herein are utilized. Moreover, a cell in accordance with the present invention can be made very small and is optimal for use in high density flash applications.

Next, certain manufacturing and integration requirements are discussed. The design of the three gate Flash memory cell for high performance operation should insure reasonable erase and programming voltages and times. What is reasonable is a function of the application and engineering trade offs in the manufacturing process. The three gate Flash cell concept is flexible to allow optimization for a range of product and manufacturing constraints and will always yield high read current. For example, one-time-programming applications or high speed and density requirement may dictate the design engineer of the three gate cell to select a process that favors lower voltage operation in return for slower program and erase. For applications which require faster revision of the Flash memory contents, high voltages for that thus rapid programming and erasure will be designed into the specifics of the implementation.

The voltages used, however, must be consistent with CMOS manufacturing methods which are cost effective for the product applications. The generation and routing of high voltages on chip for the operation of the Flash cell complicates chip manufacture and increases manufacturing costs. As circuits are scaled smaller in the future, the power supply voltage for the CMOS elements will be reduced to save power and to enable scaling of the CMOS elements. However, the introduction of high voltage elements generally required for the erasure of Flash cells, will require additional manufacturing steps. For example, field inversion thresholds must be higher, deeper junctions are needed to avoid junction breakdown at high fields, and thicker gate dielectrics are required for reliable operation of devices that perform high voltage switching and routing. These features become increasingly difficult to combine with modern high performance CMOS as the required voltages for Flash Cell operation increase above about 10 volts. Thus, it is it desirable to minimize the high voltage levels required for Flash cell operation and to use a Flash cell architecture that will allow these voltages to be scaled to lower values in accordance with CMOS technology trends.

The three gate Flash cell in accordance with the present invention allows operation at reasonable voltages for program and erase which can be integrated with high performance CMOS at reasonable costs. The user of the cell can also choose to trade increased program and erase time during operation in return for slightly lower operational voltages. This can be achieved by changing the coupling capacitance between the floating gate and other voltage nodes in the cell. For example, to increase the programming speed, the floating gate must be coupled to a higher potential than the underlying channel to attract the hot electrons for capture. Increased coupling is accomplished by increasing the source diffusion to floating gate overlap, thus allowing more of the source voltage to be coupled onto the floating gate. Thus, programming simulations show that if the floating gate is coupled to 9 to 10 Volts that programming will be fast, taking typically about 25 to 100 microseconds. The disclosed programming method is efficient in that very low currents are required for fast programming, requiring currents of only about 0.5 microamps per cell. This means that power consumption during the programming operation is modest and allows programming to take place in systems that are powered by batteries.

Figure 50:
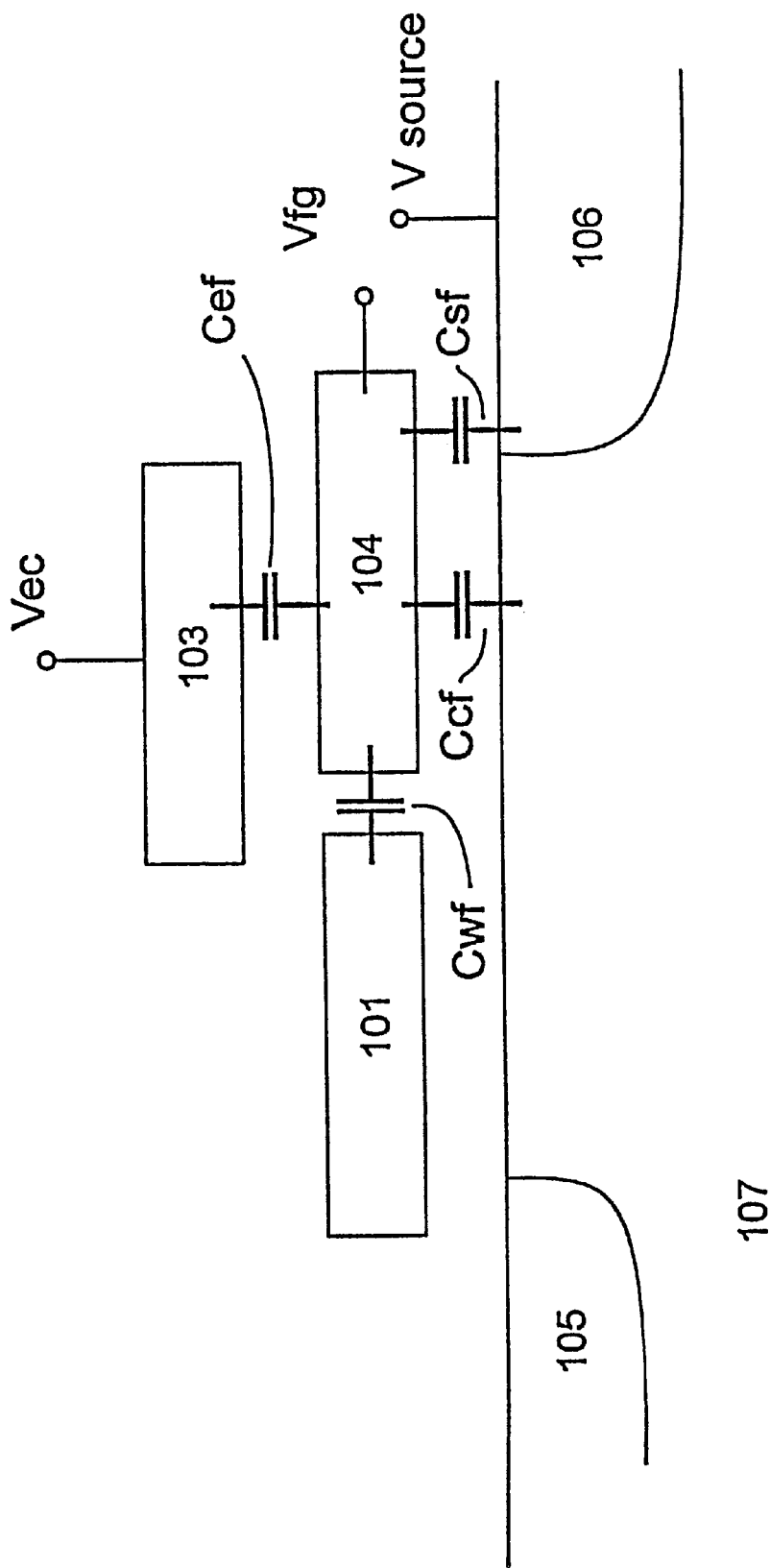
FIG. 50 is a cross section of a silicon substrate which shows the presence of the various capacitances that exists in the cell and that affect the programming and erasing operations.

A quantitative discussion of the factors affecting programming is provided with reference to FIG. 50. The voltage on the floating gate (when Vec=0) can be estimated as follows:

$$Vfg = Vsource * Cprogram$$

where, $$Cprogram = \text{capacitive coupling ratio in program mode}$$
$$= Csf / (Cef + Ccf + Cwf + Csf)$$

Because a higher floating gate voltage will cause faster programming, it is desired that Cprogram be high. While, source side injection of hot electrons is difficult to predict, (see M. Kamiya, Y. Kojima, Yi Kato, K Tanaka, and Y. Hayashi, "EEPROM Cell with high Gate-Injection Efficiency", IEDM Tech. Dig., P741, 1982) laboratory measurements show that the principle determinant of speed, as the above equation suggests, is the source diffusion to floating gate capacitance, or Csf. Indeed, Cprogram is large when the term Csf is large and the other capacitance terms are small. Csf can be made large by having a thin dielectric under the floating gate and a sufficient overlap of the floating gate over the source diffusion. While it is desired that Cwf be small, it will necessarily be a factor because of the close vicinity of the word line gate and the floating gate. Minimization of Cef is restricted by consideration of the desirable erase voltage. If Cef is reduced by increasing the dielectric thickness between the erase gate and floating gate, it will consequently be harder to erase the device. However, Cef can be kept low by using minimum area of overlap between the erase control gate and the floating gate.

The erase control gate voltage, Vec, can also be optimized during programming to affect programming speed. The above analysis assumes that Vec is at ground, which tends to hold Vfg to lower voltages due to coupling between the erase control gate and the floating gate. However, if Vec is increased, Vfg will correspondingly increase, which, as noted above, will increase programming speed. Care must be taken to choose Vec such that the cell will not be erased. Balancing these consideration, an optimal Vec for fast programming should be approximately 6 to 8 Volts. Several advantages arise from the use of a Vec bias during erase, including: the use of a Vec bias alleviates the need to have a greater floating gate to source diffusion overlap, thus making the cell more easily scaleable to smaller sizes; the potential applied to the source diffusion may be reduced which allows the junction and floating gate to be scaled to smaller dimensions; and Vec can be used to overcome the negative impact on programming operation when thinner interpoly oxides are required to optimize erasure.

Figure 46B:
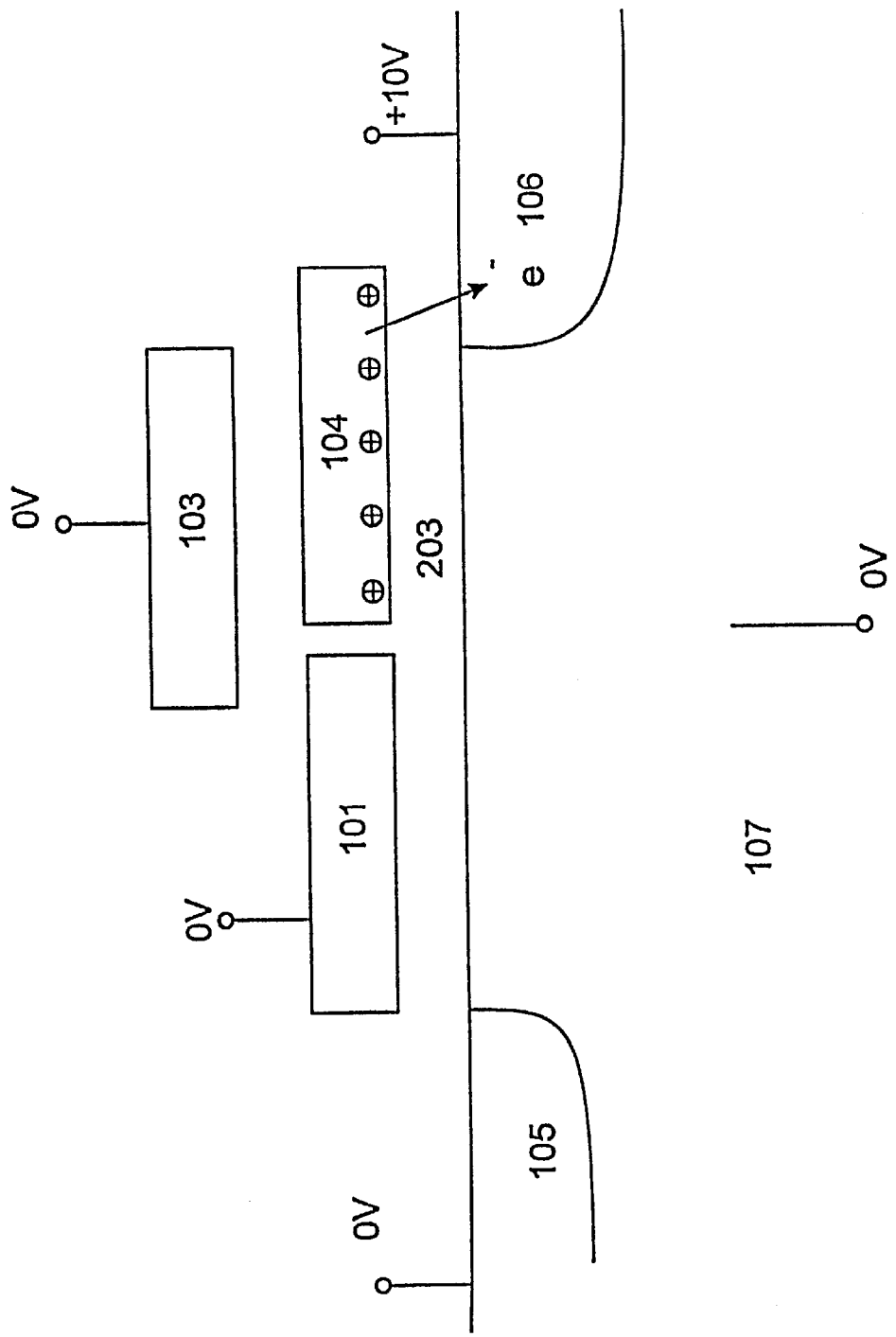
FIG. 46B is a cross section of a silicon substrate showing an embodiment of the claimed memory device and the biasing conditions that can be used to erase the device by causing charges to move through the oxide underneath the floating gate.

Erasure of the device occurs when electrons tunnel off of the floating gate as governed by the Fowler-Nordheim tunneling, a phenomenon well known in the art. It should be clear to those of ordinary skill that the three gate cells could be optimized for erasure by tunneling through the interpoly oxide (requiring low coupling from floating gate to control gate) or by tunneling from the floating gate through the underlying oxide to the source (requiring high coupling from floating gate to control gate). The potential for interpoly erasure is established by biasing the erase control gate to a high positive potential while setting all other nodes in the cell to ground. For fast erasure taking typically about 10 to 50 milliseconds, a sufficiently high electric field must be developed in the interpoly oxide between the floating gate and the erase control gate of about 8.5 megavolts/cm. The erase control gate voltage necessary to achieve this field strength is determined to a first order by the thickness of the interpoly oxide and also by the amount of coupling of voltage onto the floating gate. For fast erasure, tight coupling of the floating gate to the ground potential of the substrate is desirable so that most of the erase control gate voltage will appear across the interpoly oxide. If the potential that forms across the interpoly oxide when divided by the interpoly thickness exceeds 8.5 Megavolts/cm, electrons will be sufficiently able to tunnel and erase times will accordingly be reasonable. In other words, reasonable erase control gate voltages and reasonable erase times can be modeled for a given choice of interpoly oxide thickness and geometric layout of the cell. Interpoly erasure involves higher voltages and is more subject to trap up effects in the interpoly oxide which reduce the effectiveness of erasure with repeated cycling of the memory cell. Erasure to the source diffusion can be engineered with a different optimization of the cell and can be achieved with lower voltages. FIG. 46B illustrates this operational mode for the three gate cell. The erase control gate 103 and word line gate 101 are grounded with a high coupling between the erase control gate 103 and the floating gate 104. The overlap between the source diffusion and the floating gate would be reduced in this type of cell optimization to minimize coupling to the source when the three gate cell is optimized for this type of erase operation the application of positive bias on the erase control gate will be required to facilitate the programming operation.

Other factors will also affect erase efficiency. The electric field in the interpoly oxide is further enhanced for those cell embodiments where the erase control gate passes over the corner of the floating gate. Moreover, the exact grain structure of the floating gate polysilicon and polysilicon asperites resulting from thermal processing can cause local topology variations in the oxide thickness which will enhance Fowler-Nordheim tunneling characteristics and affect the erase time accordingly. (See, e.g., P. A. Heimann, S. P. Murarka, and T. T. Sheng, *J. Appl. Phys.*, Vol. 53, no. 9, p 6420,1982; H. S. Lee, S. P. Marin, *J. Appl. Phys.*, vol 51, no. 7, p. 3747, 1980). In fact, it is expected that a distribution of erase voltages (i.e., storage transistor threshold voltages) will result after a full chip erasure because all cells are erased concomitantly and some cells will accordingly erase faster than others. Because these normal process variations are difficult to control, the three gate cell will need to be optimized for a given manufacturing facility to provide the desired erase time or erase control gate voltage. Interpoly oxide thickness between 100 to 500 Angstroms will yield practical erase voltages and still allow charge to be retained on the floating gate during storage and reading of the memory. A strong advantage of the three gate cell disclosed herein is that a wide distributions of erase voltages and effective interpoly oxide variations will produce acceptable operation of the cell.

It may be desired not to bias the erase control gate when reading the memory cell to alleviate the possibility that a small amount of electrons will tunnel off of the floating gate under the influence of the relatively moderate read voltages. This phenomenon is known as read disturb and the fact that this unwanted phenomenon can be almost completely eradicated by the disclosed three gate cell is yet another advantage of the three gate cell over other more conventional Flash cell designs. However, as previously mentioned, biasing the erase control gate can have certain advantages during programming.

What is claimed is:

1. A process for fabricating memory cells, low voltage CMOS transistors, and high voltage CMOS transistors on a substrate, wherein each memory cell includes a control gate, a word gate and a floating gate, comprising the steps of:

(a) forming a first oxide layer on the substrate surface;

(b) depositing a first polysilicon layer on the first oxide layer;

(c) etching the first polysilicon layer to define word gates, floating gates, and low voltage CMOS transistor gates;

(d) forming a second oxide layer over the substrate surface, wherein the second oxide layer is thicker than the first oxide layer;

(e) depositing a second polysilicon layer on the second oxide layer; and (f) etching the second polysilicon layer to define high voltage CMOS transistor gates and control gates, wherein each control gate is above and overlaps one of the floating gates.

2. The process of claim 1 further comprising the step of thermally growing oxide regions in the substrate prior to step (a) to electrically isolate the memory cells from one another.

3. The process of claim 1 wherein step (c) further comprises the step of anisotropically etching thin gaps into the polysilicon to separate the word gates from the floating gates.

4. The process of claim 1 wherein each control gate partially overlaps one of the word gates.

5. The process of claim 1 further comprising the steps of:

(g) performing a first ion implantation of the substrate to form source and drain diffusion regions of the low voltage CMOS transistors and bit line diffusion regions adjacent to the word gates; and (h) performing a second ion implantation of the substrate to form source and drain diffusion regions of the high voltage CMOS transistors and source diffusion regions adjacent to the floating gates, wherein the second ion implantation is adjusted to produce deeper diffusion regions than the first ion implantation.

6. A process for fabricating memory cells and high voltage CMOS transistors on a substrate, wherein each memory cell includes a control gate, a word gate and a floating gate, comprising the steps of:

(a) forming a first oxide layer on the substrate surface;

(b) depositing a first polysilicon layer on the first oxide layer;

(c) removing the first oxide and first polysilicon layer from a first area where the high voltage CMOS transistors are to be fabricated;

(d) forming a second oxide layer over the substrate;

(e) depositing a second polysilicon layer on the second oxide layer;

(f) forming a third oxide layer on the second polysilicon layer;

(g) depositing a silicon nitride layer on the third oxide;

(h) etching the silicon nitride layer, the third oxide layer, and the second polysilicon layer outside the first area to define control gates;

(i) depositing oxide spacers on the sides of the control gates;

(h) etching the second oxide layer outside the first area to define interpoly oxide layers under the control gates;

(i) etching the first polysilicon layer to define floating gates under the interpoly oxide layers and the control gates;

(j) etching the silicon nitride layer, the third oxide layer, and the second polysilicon layer in the first area to define high voltage CMOS transistor gates;

(k) forming a thin oxide layer over the substrate;

(l) depositing dielectric spacers on the sides of all the gates;

(m) removing exposed oxide on the substrate surface;

(n) forming a fourth oxide layer over the substrate;

(o) depositing a third polysilicon layer on the fourth oxide layer; and (p) etching the third polysilicon layer to form word gates, wherein a portion of each word gate is above and overlaps one of the control gates.

7. The process of claim 6 wherein the exposed oxide is removed in step (m) using a diluted solution of hydrofluoric acid.

8. The process of claim 7 wherein step (o) further includes the step of etching the third polysilicon layer to form low voltage CMOS transistor gates.

9. The process of claim 8 further comprising the steps of:

(q) performing a first ion implantation of the substrate to form source and drain diffusion regions on opposite sides of the low voltage CMOS transistor gate and bit line diffusion regions adjacent to the word gates; and (r) performing a second ion implantation of the substrate to form source and drain diffusion regions of the high voltage CMOS transistors and source diffusion regions adjacent to the floating gates, wherein the second ion implantation is adjusted to produce deeper diffusion regions than the first ion implantation.

* * * * *